(12) United States Patent
Lee et al.

(10) Patent No.: US 12,087,805 B2
(45) Date of Patent: Sep. 10, 2024

(54) DISPLAY DEVICE

(71) Applicant: SAMSUNG DISPLAY CO., LTD., Yongin-si (KR)

(72) Inventors: Jin Hyeong Lee, Suwon-si (KR); Su Jeong Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 424 days.

(21) Appl. No.: 17/480,468

(22) Filed: Sep. 21, 2021

(65) Prior Publication Data

US 2022/0208849 A1   Jun. 30, 2022

(30) Foreign Application Priority Data

Dec. 28, 2020   (KR) .................. 10-2020-0185323

(51) Int. Cl.
*H01L 27/15*   (2006.01)
*H01L 33/10*   (2010.01)
(Continued)

(52) U.S. Cl.
CPC ............ *H01L 27/156* (2013.01); *H01L 33/10* (2013.01); *H01L 33/382* (2013.01); *H01L 33/44* (2013.01);
(Continued)

(58) Field of Classification Search
CPC ..... H01L 27/156; H01L 33/10; H01L 33/382; H01L 33/44; H01L 33/50; H01L 33/54; H01L 33/507; H01L 33/58; H01L 25/167; H01L 25/0753; H01L 33/501; H01L 33/62; H01L 2933/0091; H01L 27/1214;
(Continued)

(56) References Cited

U.S. PATENT DOCUMENTS

2016/0293676 A1*  10/2016  Komatsu .............. H10K 59/351
2019/0148458 A1*   5/2019  Kim ..................... H10K 50/115
                                                          257/89
(Continued)

FOREIGN PATENT DOCUMENTS

KR   10-2018-0087908 A    8/2018
KR   10-2018-0114979 A   10/2018
(Continued)

*Primary Examiner* — Patricia D Valenzuela
(74) *Attorney, Agent, or Firm* — Lewis Roca Rothgerber Christie LLP

(57) ABSTRACT

A display device includes: a substrate including a first light emitting region, a second light emitting region, a third light emitting region, and a light blocking region configured to partition the first to third light emitting regions; a plurality of light emitting elements on the substrate and respectively located in the first light emitting region, the second light emitting region, and the third light emitting region; a planarization layer on the plurality of light emitting elements; a wavelength conversion layer on the planarization layer and including wavelength conversion parts, a light transmitting part, and a color conversion member; and a color filter layer on the wavelength conversion layer and including a color filter, and the wavelength conversion parts are located in each of the first light emitting region and the second light emitting region, the light transmitting part is located in the third light emitting region.

20 Claims, 12 Drawing Sheets

(51) Int. Cl.
  *H01L 33/38* (2010.01)
  *H01L 33/44* (2010.01)
  *H01L 33/50* (2010.01)
  *H01L 33/54* (2010.01)
  *H10K 59/35* (2023.01)
  *H10K 71/16* (2023.01)

(52) U.S. Cl.
  CPC .............. *H01L 33/50* (2013.01); *H01L 33/54* (2013.01); *H10K 59/351* (2023.02); *H10K 71/16* (2023.02)

(58) Field of Classification Search
  CPC ....... H01L 33/52; G02B 5/201; G02B 6/0026; H10K 71/16; H10K 59/351
  See application file for complete search history.

(56) References Cited

U.S. PATENT DOCUMENTS

| | | |
|---|---|---|
| 2021/0202452 A1 | 7/2021 | Kim et al. |
| 2021/0202803 A1 | 7/2021 | Park et al. |
| 2021/0399177 A1 | 12/2021 | Bae et al. |

FOREIGN PATENT DOCUMENTS

| | | |
|---|---|---|
| KR | 10-2019-0034379 A | 4/2019 |
| KR | 10-2019-0115131 A | 10/2019 |
| KR | 10-2020-0006651 A | 1/2020 |
| KR | 10-2020-0026361 A | 3/2020 |
| KR | 10-2021-0086805 | 7/2021 |
| KR | 10-2021-0086807 | 7/2021 |
| KR | 10-2021-0157949 | 12/2021 |

\* cited by examiner

FIG. 1
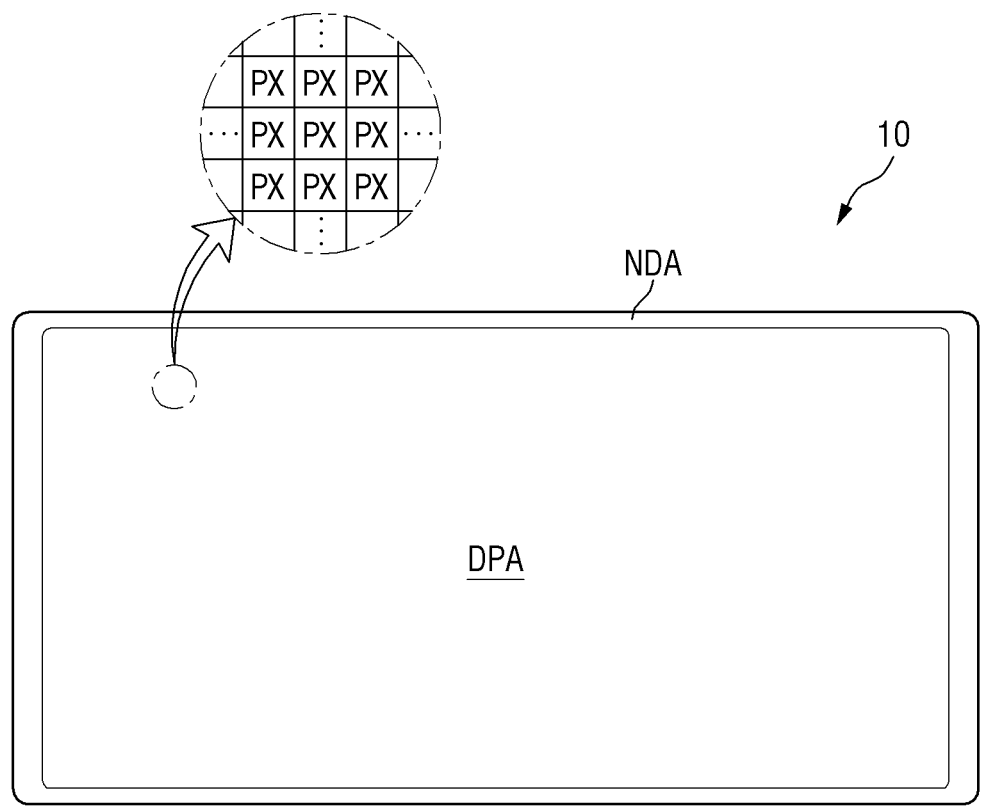
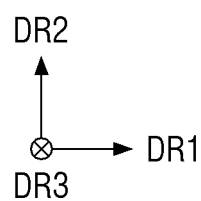

DISPLAY DEVICE

CROSS-REFERENCE TO RELATED APPLICATION

This application claims priority to and the benefit of Korean Patent Application No. 10-2020-0185323, filed on Dec. 28, 2020 in the Korean Intellectual Property Office, the entire disclosure of which is incorporated herein by reference.

BACKGROUND

1. Field

Aspects of embodiments of the present disclosure relate to a display device.

2. Description of the Related Art

The importance of display devices is increasing with the development of multimedia. Accordingly, various types of display devices, such as an organic light emitting display (OLED) device, a liquid crystal display (LCD) device, and the like are being used.

A device which displays an image of the display device includes a display panel, such as an organic light emitting display panel or a liquid crystal display panel. Among the above, the light emitting display panel may include a light emitting element, and, for example, the case of a light emitting diode (LED) includes an organic light emitting diode (OLED) using an organic material as a light emitting material, an inorganic light emitting diode using an inorganic material as a light emitting material, and the like.

SUMMARY

According to an aspect of one or more embodiments of the present disclosure, a display device capable of reducing reflection of external light to improve display quality is provided.

However, aspects and objects of the present disclosure are not limited to those mentioned above, and other aspects and objects which are not mentioned may be apparently understood from the following descriptions by those skilled in the art.

According to one or more embodiments of the present disclosure, a display device comprises: a substrate including a first light emitting region, a second light emitting region, a third light emitting region, and a light blocking region configured to partition the first to third light emitting regions; a plurality of light emitting elements disposed on the substrate and respectively disposed in the first light emitting region, the second light emitting region, and the third light emitting region; a planarization layer disposed on the plurality of light emitting elements; a wavelength conversion layer disposed on the planarization layer and including wavelength conversion parts, a light transmitting part, and a color conversion member; and a color filter layer disposed on the wavelength conversion layer and including a color filter, wherein the wavelength conversion parts are disposed in each of the first light emitting region and the second light emitting region, the light transmitting part is disposed in the third light emitting region, and the color conversion member does not overlap the light blocking region and is disposed between the planarization layer and the wavelength conversion part and between the planarization layer and the light transmitting part.

In an embodiment, the color conversion member is disposed closer to the light emitting elements than the wavelength conversion parts and the light transmitting part.

In an embodiment, the color conversion member transmits light having a color that is the same as a color of light emitted from the plurality of light emitting elements.

In an embodiment, the color conversion member is a color filter configured to transmit blue light.

In an embodiment, a refractive index of the color conversion member is greater than a refractive index of the planarization layer.

In an embodiment, the wavelength conversion layer includes a first light blocking member disposed on the planarization layer, and the first light blocking member overlaps the light blocking region and does not overlap the first light emitting region, the second light emitting region, and the third light emitting region.

In an embodiment, the color conversion member, the wavelength conversion part, and the light transmitting part are disposed between the first light blocking member.

In an embodiment, the color filter layer includes a reflection layer and a second light blocking member disposed on the wavelength conversion layer, and the reflection layer and the second light blocking member overlap the first light emitting region, the second light emitting region, the third light emitting region, and the light blocking region.

In an embodiment, the reflection layer includes a plurality of first holes overlapping the first light emitting region, the second light emitting region, and the third light emitting region, the second light blocking member includes a plurality of second holes overlapping the first light emitting region, the second light emitting region, and the third light emitting region, and the plurality of first holes and the plurality of second holes overlap each other.

In an embodiment, planar shapes of the plurality of first holes and the plurality of second holes are stripe shapes or dot shapes.

In an embodiment, the color filter is disposed in each of the first light emitting region and the second light emitting region and does not overlap the third light emitting region.

In an embodiment, the color filter is a color filter configured to block blue light.

In an embodiment, the display device further comprises: a first electrode and a second electrode disposed on the substrate and extending in a direction, a light emitting element of the plurality of light emitting elements being aligned on the first electrode and the second electrode; and a first connection electrode connected to a first end portion of the light emitting element, and a second connection electrode connected to a second end portion of the light emitting element.

In an embodiment, the light emitting element includes a first semiconductor layer, a second semiconductor layer disposed on the first semiconductor layer, a light emitting layer disposed between the first semiconductor layer and the second semiconductor layer, and an insulating film around the first semiconductor layer, the second semiconductor layer, and the light emitting layer.

According to one or more embodiments of the present disclosure, a display device comprises: a substrate including a first light emitting region, a second light emitting region, a third light emitting region, and a light blocking region configured to partition the first to third light emitting regions; a plurality of light emitting elements disposed on the substrate and disposed in each of the first light emitting region, the second light emitting region, and the third light emitting region; an encapsulation layer disposed on the plurality of light emitting elements; a wavelength conversion layer disposed on the encapsulation layer and including wavelength conversion parts, a light transmitting part, and a color conversion member; and a color filter layer disposed on the wavelength conversion layer and including a color filter, wherein the color conversion member is disposed on the encapsulation layer, the wavelength conversion parts are respectively disposed in each of the first light emitting region and the second light emitting region on the color conversion member, the light transmitting part is disposed in the third light emitting region on the color conversion member, and the color conversion member overlaps the first light emitting region, the second light emitting region, the third light emitting region, and the light blocking region.

In an embodiment, the wavelength conversion layer includes a first light blocking member overlapping the light blocking region, and the color conversion member contacts an upper surface of the encapsulation layer and contacts lower surfaces of the first light blocking member, the wavelength conversion parts, and the light transmitting part.

In an embodiment, the display device further comprises a planarization layer disposed between the encapsulation layer and the color conversion member, wherein a lower surface of the color conversion member contacts an upper surface of the planarization layer.

In an embodiment, a thickness of the color conversion member is the same in the first light emitting region, the second light emitting region, and the third light emitting region.

In an embodiment, a refractive index of the color conversion member is greater than a refractive index of the planarization layer.

In an embodiment, the color conversion member transmits light having a color that is the same as a color of light emitted from the plurality of light emitting elements.

BRIEF DESCRIPTION OF THE DRAWINGS

The above and other aspects and features of the present disclosure will become more apparent by describing some embodiments thereof in further detail with reference to the attached drawings, in which:

FIG. 1 is a schematic plan view of a display device according to an embodiment;

DETAILED DESCRIPTION

Figure 2:
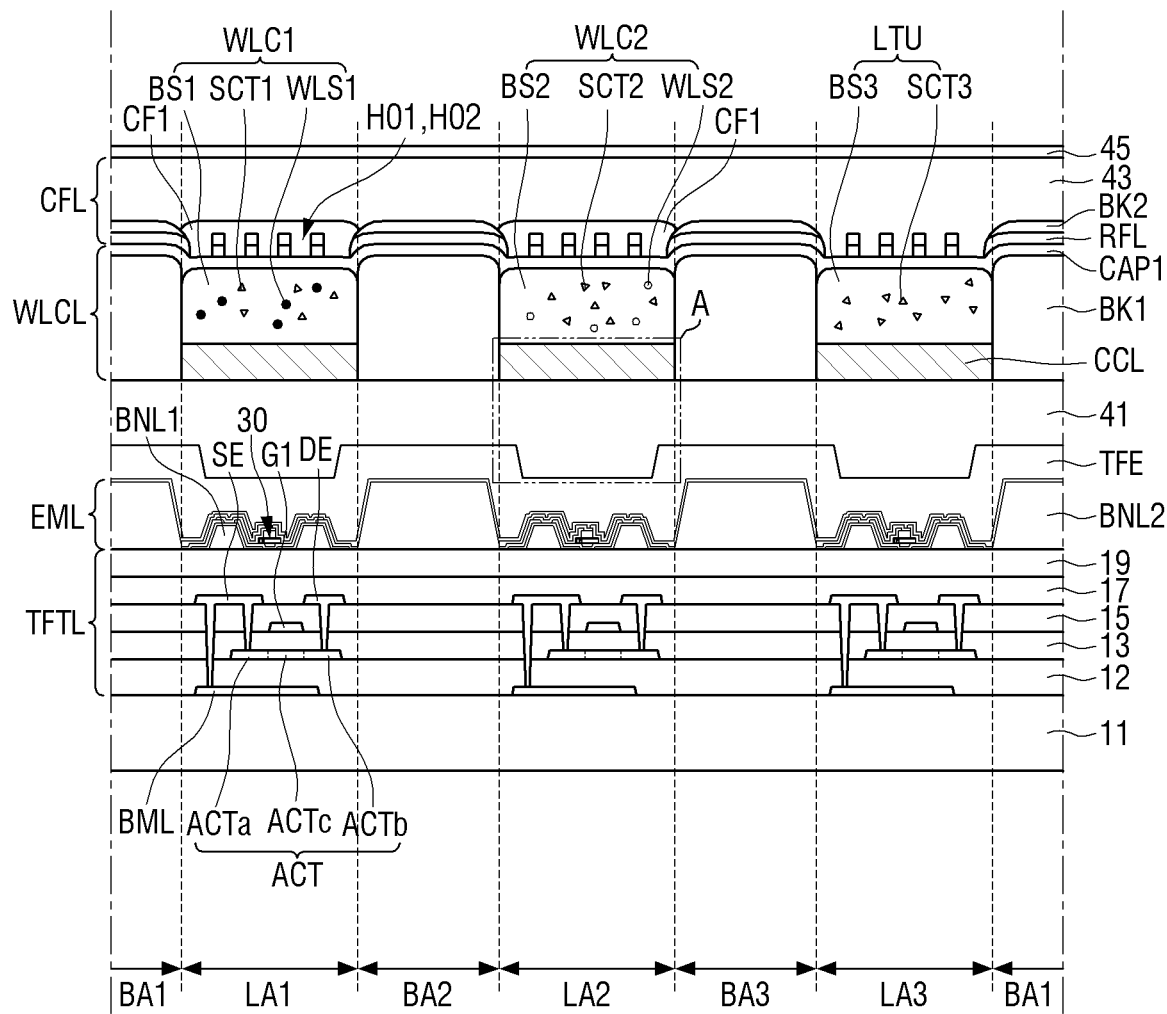
FIG. 2 is a cross-sectional view schematically illustrating some sub-pixels of a display device according to an embodiment.

The present invention will now be described more fully herein with reference to the accompanying drawings, in which some embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It is to be understood that when a layer is referred to as being "on" another layer or substrate, it may be directly on the other layer or substrate, or one or more intervening layers may also be present. The same reference numbers indicate the same or like components throughout the specification.

It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole. Each embodiment may be implemented independently of each other or may be implemented together in an association.

Spatially relative terms, such as "beneath," "below," "lower," "above," "upper," "bottom," "top," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Herein, some embodiments will be described with reference to the accompanying drawings.

FIG. 1 is a schematic plan view of a display device according to an embodiment.

Referring to FIG. 1, a display device 10 displays videos or still images. The display device 10 may refer to any electronic device which provides a display screen. For example, the display device 10 may include any of a television, a notebook, a monitor, a billboard, an Internet of Things device, a mobile phone, a smartphone, a tablet personal computer (PC), an electronic watch, a smart watch, a watch phone, a head mounted display, a mobile communication terminal, an electronic organizer, an e-book reader, a portable multimedia player (PMP), a navigation device, a game console, a digital camera, a camcorder, and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel, a field emission display panel, and the like. Herein, a case in which an inorganic light emitting diode display panel is applied as an example of the display panel is described, but the present disclosure is not limited thereto, and when the same technical spirit is applicable, other display panels may be applied.

In the drawing illustrating the display device 10, a first direction DR1, a second direction DR2, and a third direction DR3 are defined. The first direction DR1 and the second direction DR2 may be directions perpendicular to each other in a plane. The third direction DR3 may be a direction perpendicular to the plane in which the first direction DR1 and the second direction DR2 are located. The third direction DR3 is perpendicular to each of the first direction DR1 and the second direction DR2. In an embodiment describing the display device 10, the third direction DR3 represents a thickness direction of the display device 10.

A shape of the display device 10 may be variously modified. For example, the display device 10 may have a rectangular shape including long sides in the first direction DR1 longer than in the second direction DR2 in a plan view. As another example, the display device 10 may have a rectangular shape including long sides in the second direction DR2 longer than in the first direction DR1 in a plan view. However, the present disclosure is not limited thereto, and the display device 10 may have a shape such as a square shape, a quadrangular shape with a round corner (vertex), other polygonal shapes, a circular shape, or the like. In an embodiment, a shape of a display region DPA of the display device 10 may be similar to an overall shape of the display device 10. In FIG. 1, the display device 10 and the display region DPA having a rectangular shape in which sides in the first direction DR1 are longer than sides in the second direction DR2 are illustrated as an example.

The display device 10 may include the display region DPA and a non-display region NDA. The display region DPA is a region where an image may be displayed, and the non-display region NDA is a region where an image is not displayed. The display region DPA may be referred to as an active region, and the non-display region NDA may be referred to as an inactive region. In an embodiment, the display region DPA may generally occupy a center of the display device 10.

The display region DPA may include a plurality of pixels PX. The plurality of pixels PX may be arranged in a matrix form. A shape of each pixel PX may be a rectangular shape or a square shape in a plan view but is not limited thereto and may be a rhombus shape in which each side is inclined with respect to a direction. The pixels PX may be alternately arranged in a stripe type or a Pentile type. In addition, each of the pixels PX may include one or more light emitting elements which emits light of a specific wavelength band to display a specific color.

The non-display region NDA may be disposed around the display region DPA. The non-display region NDA may completely or partially surround the display region DPA. In an embodiment, the display region DPA has a rectangular or generally rectangular shape, and the non-display region NDA may be disposed adjacent to four sides of the display region DPA. The non-display region NDA may form a bezel of the display device 10. In the non-display region NDA, lines or circuit drivers included in the display device 10 may be disposed or external devices may be mounted.

FIG. 2 is a cross-sectional view schematically illustrating some sub-pixels of the display device according to an embodiment.

Referring to FIG. 2, the display region DPA of the display device 10 may include first to third light emitting regions LA1, LA2, and LA3. Each of the first to third light emitting regions LA1, LA2, and LA3 may be a region in which light generated by a light emitting element 30 of the display device 10 is emitted to the outside of the display device 10. Further, the display region of the display device 10 may include first to third light blocking regions BA1, BA2, and BA3 which partition and surround the first to third light emitting regions LA1, LA2, and LA3.

The display device 10 may include a substrate 11, a buffer layer 12, a transistor layer TFTL, a light emitting element layer EML, a wavelength conversion layer WLCL, and a color filter layer CFL.

The substrate 11 may be a base substrate or a base member and may be formed of an insulating material, such as a polymer resin or the like. For example, the substrate 11 may be a flexible substrate that can be bent, folded, rolled, or the like. In an embodiment, the substrate 11 may include polyimide (PI), but is not limited thereto.

The buffer layer 12 may be disposed on the substrate 11. The buffer layer 12 may be formed of an inorganic film capable of preventing or substantially preventing permeation of air or moisture. For example, the buffer layer 12 may include a plurality of inorganic films which are alternately stacked.

The transistor layer TFTL may be disposed on the buffer layer 12. The transistor layer TFTL may include a first transistor T1, a first gate insulating layer 13, a first interlayer insulating layer 15, a second interlayer insulating layer 17, and a first planarization layer 19.

The first transistor T1 may be disposed on the buffer layer 12 and may constitute a pixel circuit of each of the plurality of pixels. For example, the first transistor T1 may be a driving transistor or a switching transistor of the pixel circuit. The first transistor T1 may include an active layer ACT, a gate electrode G1, a source electrode SE, and a drain electrode DE. The active layer ACT may include a plurality of conductive regions ACTa and ACTb and a channel region ACTc disposed therebetween.

The light emitting element layer EML may be disposed on the transistor layer TFTL. The light emitting element layer EML may include a first pattern BNL1, a light emitting element 30, and a second pattern BNL2. The light emitting element 30 may be disposed on the first transistor T1. The light emitting element 30 may be disposed between a first electrode and a second electrode and may be connected to each of a first connection electrode and a second connection electrode.

Further descriptions of the above-described transistor layer TFTL and light emitting element layer EML will be provided later with reference to FIGS. 3 to 5.

An encapsulation layer TFE may be disposed on the light emitting element layer EML. The encapsulation layer TFE may cover upper and side surfaces of the light emitting element layer EML. For example, the encapsulation layer TFE may include at least one inorganic film to prevent or substantially prevent permeation of oxygen or moisture. In an embodiment, the encapsulation layer TFE may include at least one organic film to protect the light emitting element layer EML from foreign substances, such as dust. For example, the encapsulation layer TFE may have a structure in which at least one organic film is stacked between two inorganic films. Each of the inorganic films may include any of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, lithium fluoride, and the like. In an embodiment, the organic film may include any of an acrylic resin, a methacrylic resin, polyisoprene, a vinyl resin, an epoxy resin, a urethane resin, a cellulose resin, and a perylene resin. However, the structure of the encapsulation layer TFE is not limited to the above-described example, and a stacked structure thereof may be variously changed.

A second planarization layer 41 may be disposed on the encapsulation layer TFE to planarize an upper portion of the encapsulation layer TFE. In an embodiment, the second planarization layer 41 may include an organic material. For example, the second planarization layer 41 may include at least one among an acrylic resin, an epoxy resin, a phenolic resin, a polyamide resin, and a polyimide resin.

The wavelength conversion layer WLCL may be disposed on the second planarization layer 41. The wavelength conversion layer WLCL may include a first light blocking member BK1, a first wavelength conversion part WLC1, a second wavelength conversion part WLC2, a light transmitting part LTU, and a first capping layer CAP1. Further, the wavelength conversion layer WLCL may further include a color conversion member CCL. A further detailed description of the color conversion member CCL will be provided later.

The first light blocking member BK1 may be disposed to overlap the first to third light blocking regions BA1, BA2, and BA3 on the second planarization layer 41. The first light blocking member BK1 may overlap the second pattern BNL2 in a thickness direction. The first light blocking member BK1 may block the transmission of light. The first light blocking member BK1 prevents or substantially prevents light from penetrating between the first to third light emitting regions LA1, LA2, and LA3 to prevent or substantially prevent the mixing of colors, thereby enhancing color reproduction (color gamut). In an embodiment, the first light blocking member BK1 may be disposed in a lattice shape surrounding the first to third light emitting regions LA1, LA2, and LA3 in a plan view. The first light blocking member BK1 may be disposed without overlapping the first to third light emitting regions LA1, LA2, and LA3.

In an embodiment, the first light blocking member BK1 may include an organic light blocking material and a liquid repellent component. Here, the liquid repellent component may be formed of a fluorine-containing monomer or a fluorine-containing polymer and, in an embodiment, may include a fluorine-containing aliphatic polycarbonate. For example, the first light blocking member BK1 may be made of a black organic material including the liquid repellent component. The first light blocking member BK1 may be formed through coating and exposure processes of the organic light blocking material including the liquid repellent component.

Since the first light blocking member BK1 includes a liquid repellent component, the first and second wavelength conversion parts WLC1 and WLC2 and the light transmitting part LTU may be separated into corresponding light emitting regions LA1 to LA3. For example, when the first and second wavelength conversion parts WLC1 and WLC2 and the light transmitting part LTU are formed in an inkjet method, an ink composition may flow on an upper surface of the first light blocking member BK1. In this case, since the first light blocking member BK1 includes the liquid repellent component, it is possible to induce the ink composition to flow into each light emitting region. Accordingly, the first light blocking member BK1 may prevent or substantially prevent the ink composition from being mixed.

The first wavelength conversion part WLC1 may be disposed in the first light emitting region LA1 on the second planarization layer 41. The first wavelength conversion part WLC1 may be surrounded by the first light blocking member BK1. In an embodiment, the first wavelength conversion part WLC1 may include a first base resin BS1, a first scatterer SCT1, and a first wavelength shifter WLS1.

The first base resin BS1 may include a material having a relatively high light transmittance. The first base resin BS1 may be made of a transparent organic material. For example, the first base resin BS1 may include at least one of organic materials such as an epoxy resin, an acrylic resin, a cardo resin, an imide resin, and the like.

The first scatterer SCT1 may have a refractive index different from that of the first base resin BS1 and may form an optical interface with the first base resin BS1. For example, the first scatterer SCT1 may include light scattering materials or light scattering particles which scatter at least some of the transmitted light. For example, the first scatterer SCT1 may include a metal oxide particle, such as titanium oxide ($TiO_2$), zirconium oxide ($ZrO_2$), aluminum oxide ($Al_xO_y$), indium oxide ($In_2O_3$), zinc oxide (ZnO), or tin oxide ($SnO_2$), or may include an organic particle, such as an acrylic resin or a urethane resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to a first peak wavelength. For example, the first wavelength shifter WLS1 may convert blue light provided from the light emitting element layer EML to red light having a single peak wavelength in a range of 610 nm to 650 nm and emit the red light. In an embodiment, the first wavelength shifter WLS1 may be a quantum dot, a quantum rod, or a phosphor. The quantum dot may be a particulate matter which emits a specific color while electrons transition from a conduction band to a valence band.

For example, the quantum dot may be a semiconductor nanocrystalline material. The quantum dot may have a specific band gap according to the composition and size thereof, absorb light, and then emit light having a unique wavelength. Examples of the semiconductor nanocrystal of the quantum dot may include a group IV nanocrystal, a group II-VI compound nanocrystal, a group III-V compound nanocrystal, a group IV-VI nanocrystal, a combination thereof, and the like.

For example, the quantum dot may have a core-shell structure including a core including the above-described nanocrystal and a shell surrounding the core. The shell of the quantum dot may serve as a protective layer for maintaining semiconductor characteristics by preventing or substantially preventing chemical modification of the core and may serve as a charging layer for imparting electrophoretic characteristics to the quantum dot. The shell may be a single layer or multilayer. An interface between the core and the shell may have a concentration gradient in which a concentration of elements which are present in the shell decreases toward a center. The shell of the quantum dot may be formed of a metal or non-metal oxide, a semiconductor compound, or a combination thereof.

In an embodiment, light emitted by the first wavelength shifter WLS1 may have a full width of half maximum (FWHM) of an emission wavelength spectrum of 45 nm or less, 40 nm or less, or 30 nm or less, and color purity and color reproducibility of the color displayed by the display device 10 can be further improved. The light emitted by the first wavelength shifter WLS1 may be emitted in various directions regardless of the incident direction of the incident light. Accordingly, it is possible to enhance lateral visibility of a red color displayed in the first light emitting region LA1.

Some of the blue light provided from the light emitting element layer EML may pass through the first wavelength conversion part WLC1 without being converted into red light by the first wavelength shifter WLS1. Among the blue light provided by the light emitting element layer EML, light incident on a first color filter CF1 without being converted by the first wavelength conversion part WLC1 may be blocked by the first color filter CF1. Further, the red light converted by the first wavelength conversion part WLC1 among blue light provided from the light emitting element layer EML may pass through the first color filter CF1 and may be emitted to the outside. Accordingly, the first light emitting region LA1 may emit the red light.

The second wavelength conversion part WLC2 may be disposed in the second light emitting region LA2 on the second planarization layer 41. The second wavelength conversion part WLC2 may be surrounded by the first light blocking member BK1. The second wavelength conversion part WLC2 may include a second base resin BS2, a second scatterer SCT2, and a second wavelength shifter WLS2.

The second base resin BS2 may include a material having a relatively high light transmittance. The second base resin BS2 may be formed of a transparent organic material. For example, the second base resin BS2 may be formed of the same material as the first base resin BS1 or may be formed of the example material of the first base resin BS1.

The second scatterer SCT2 may have a refractive index different from that of the second base resin BS2 and may form an optical interface with the second base resin BS2. For example, the second scatterer SCT2 may include light scattering materials or light scattering particles which scatter at least some of the transmitted light. For example, the second scatterer SCT2 may be formed of the same material as the first scatterer SCT1 or may be formed of the example material of the first scatterer SCT1. The second scatterer SCT2 may scatter light in a random direction regardless of an incident direction of incident light without substantially converting a peak wavelength of the incident light.

The second wavelength shifter WLS2 may convert or shift the peak wavelength of the incident light to a second peak wavelength different from the first peak wavelength of the first wavelength shifter WLS1. For example, the second wavelength shifter WLS2 may convert blue light provided from the light emitting element layer EML to green light having a single peak wavelength in a range of 510 nm to 550 nm and emit the green light. In an embodiment, the second wavelength shifter WLS2 may be a quantum dot, a quantum rod, or a phosphor. The second wavelength shifter WLS2 may include a material having the same effect as the example material of the first wavelength shifter WLS1. A wavelength conversion range of the second wavelength shifter WLS2 may be formed of a quantum dot, a quantum rod, or a phosphor to be different from a wavelength conversion range of the first wavelength shifter WLS1.

The light transmitting part LTU may be disposed in the third light emitting region LA3 on the second planarization layer 41. The light transmitting part LTU may be surrounded by the first light blocking member BK1. The light transmitting part LTU may transmit the incident light by maintaining a peak wavelength. The light transmitting part LTU may include a third base resin BS3 and a third scatterer SCT3.

The third base resin BS3 may include a material having a relatively high light transmittance. The third base resin BS3 may be formed of a transparent organic material. For example, the third base resin BS3 may be formed of the same material as the first or second base resin BS1 or BS2 or may be formed of the example material of the first or second base resin BS1 or BS2.

The third scatterer SCT3 may have a refractive index different from that of the third base resin BS3 and may form an optical interface with the third base resin BS3. For example, the third scatterer SCT3 may include light scattering materials or light scattering particles which scatter at least some of the transmitted light. For example, the third scatterer SCT3 may be formed of the same material as the first or second scatterer SCT1 or SCT2, or the example material of the first or second scatterer SCT1 or SCT2. The third scatterer SCT3 may scatter light in a random direction regardless of an incident direction of incident light without substantially converting a peak wavelength of the incident light.

In an embodiment, since the wavelength conversion layer WLCL is directly disposed on the second planarization layer 41, the display device 10 may not require a separate substrate for the first and second wavelength conversion parts WLC1 and WLC2 and the light transmitting part LTU. Accordingly, the first and second wavelength conversion parts WLC1 and WLC2 and the light transmitting part LTU may be easily aligned in the first to third light emitting regions LA1, LA2, and LA3, respectively, and a thickness of the display device 10 may be reduced.

The first capping layer CAP1 may cover the first and second wavelength conversion parts WLC1 and WLC2, the light transmitting part LTU, and the first light blocking member BK1. For example, the first capping layer CAP1 may seal the first and second wavelength conversion parts WLC1 and WLC2 and the light transmitting part LTU to prevent or substantially prevent damage or contamination of the first and second wavelength conversion parts WLC1 and WLC2 and the light transmitting part LTU. In an embodiment, the first capping layer CAP1 may include an inorganic material. For example, the first capping layer CAP1 may include at least one among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The color filter layer CFL may be disposed on the first capping layer CAP1. The color filter layer CFL may include a reflection layer RFL, a second light blocking member BK2, the first color filter CF1, and a third planarization layer 43.

The reflection layer RFL may be disposed on the first capping layer CAP1 of the wavelength conversion layer WLCL to overlap first to third light emitting regions LA1, LA2, and LA3 and the first to third light blocking regions BA1, BA2, and BA3. The reflection layer RFL reflects the blue light provided from the light emitting element layer EML downward and is re-reflected and emitted from electrodes of the lower light emitting element layer EML, thereby enhancing efficiency of the blue light. The reflection layer RFL may include a plurality of first holes HO1 overlapping the first to third light emitting regions LA1, LA2, and LA3. The first to third light emitting regions LA1, LA2, and LA3 are regions from which light is emitted to the outside, and the light may be emitted to the outside through the plurality of first holes HO1. The reflection layer RFL is also disposed in a region overlapping the first to third light emitting regions LA1, LA2, and LA3, thereby further enhancing the efficiency of the blue light.

The second light blocking member BK2 may be disposed on the reflection layer RFL to overlap the first to third light emitting regions LA1, LA2, and LA3 and the first to third light blocking regions BA1, BA2, and BA3. The second light blocking member BK2 may overlap the first light blocking member BK1, the reflection layer RFL, and/or the second pattern BNL2 in the thickness direction. The second light blocking member BK2 may block the transmission of light. The second light blocking member BK2 prevents or substantially prevents light from penetrating between the first to third light emitting regions LA1, LA2, and LA3 to prevent or substantially prevent the mixing of colors, thereby enhancing color reproduction (color gamut). Further, the second light blocking member BK2 may absorb light incident from the outside to reduce reflectance of external light.

Like the reflection layer RFL, the second light blocking member BK2 may include a plurality of second holes HO2 overlapping the first to third light emitting regions LA1, LA2, and LA3. The first to third light emitting regions LA1, LA2, and LA3 are regions from which light is emitted to the outside, and the light may be emitted to the outside through the plurality of second holes HO2.

The first color filter CF1 may be disposed in the first light emitting region LA1 and the second light emitting region LA2 on the first capping layer CAP1. The first color filter CF1 may be surrounded, or partially surrounded, by the reflection layer RFL and the second light blocking member BK2 and may cover at least portions of the reflection layer RFL and the second light blocking member BK2 in the first light emitting region LA1 and the second light emitting region LA2. The first color filter CF1 may overlap the first wavelength conversion part WLC1 and the second wavelength conversion part WLC2 in the thickness direction.

The first color filter CF1 may prevent or substantially prevent an occurrence of color mixing of blue light provided from the light emitting element layer EML, and light which passes through the first wavelength conversion part WLC1 and the second wavelength conversion part WLC2 and then is converted to light of a first color (for example, red light) and light of a second color (for example, green light). For example, the first color filter CF1 blocks the blue light which is not converted by the first wavelength conversion part WLC1 and blocks blue light which is not converted by the second wavelength conversion part WLC2. Accordingly, the first color filter CF1 may block blue light in the first light emitting region LA1 and the second light emitting region LA2 to emit pure first color light (for example, red light) and pure second color light (for example, green light).

The first color filter CF1 is disposed to overlap each of the first light emitting region LA1 and the second light emitting region LA2 and is disposed without overlapping the third light emitting region LA3 and, thus, light of a third color (for example, blue light) emitted from the third light emitting region LA3 through the light transmitting part LTU may be emitted. The first color filter CF1 may absorb some of light introduced from the outside of the display device 10 to reduce reflected light caused by the external light.

Since the first color filter CF1 is directly disposed on the first capping layer CAP1 of the wavelength conversion layer WLCL, the display device 10 may not require a separate substrate for the first color filter CF1. Accordingly, the thickness of the display device 10 may be reduced.

The third planarization layer 43 may be disposed on the second light blocking member BK2, the first color filter CF1, and the first capping layer CAP1. The third planarization layer 43 may planarize upper portions of the second light blocking member BK2, the first color filter CF1, and the first capping layer CAP1. In an embodiment, the third planarization layer 43 may be formed of the same material as the second planarization layer 41 or may be formed of the example material of the second planarization layer 41.

In an embodiment, a reflection prevention member 45 may be disposed on the third planarization layer 43. The reflection prevention member 45 may absorb light incident from the outside and prevent or substantially prevent display quality from degrading due to reflection of the external light. In an embodiment, the reflection prevention member 45 may include a dye capable of absorbing light other than the light of the first to third colors (for example, red, green, and blue), to prevent or substantially prevent reflection of the external light.

Herein, the transistor layer TFTL and the light emitting element layer EML will be described in further detail through a planar structure and a cross-sectional structure of a pixel of the display device 10 according to an embodiment.

Figure 3:
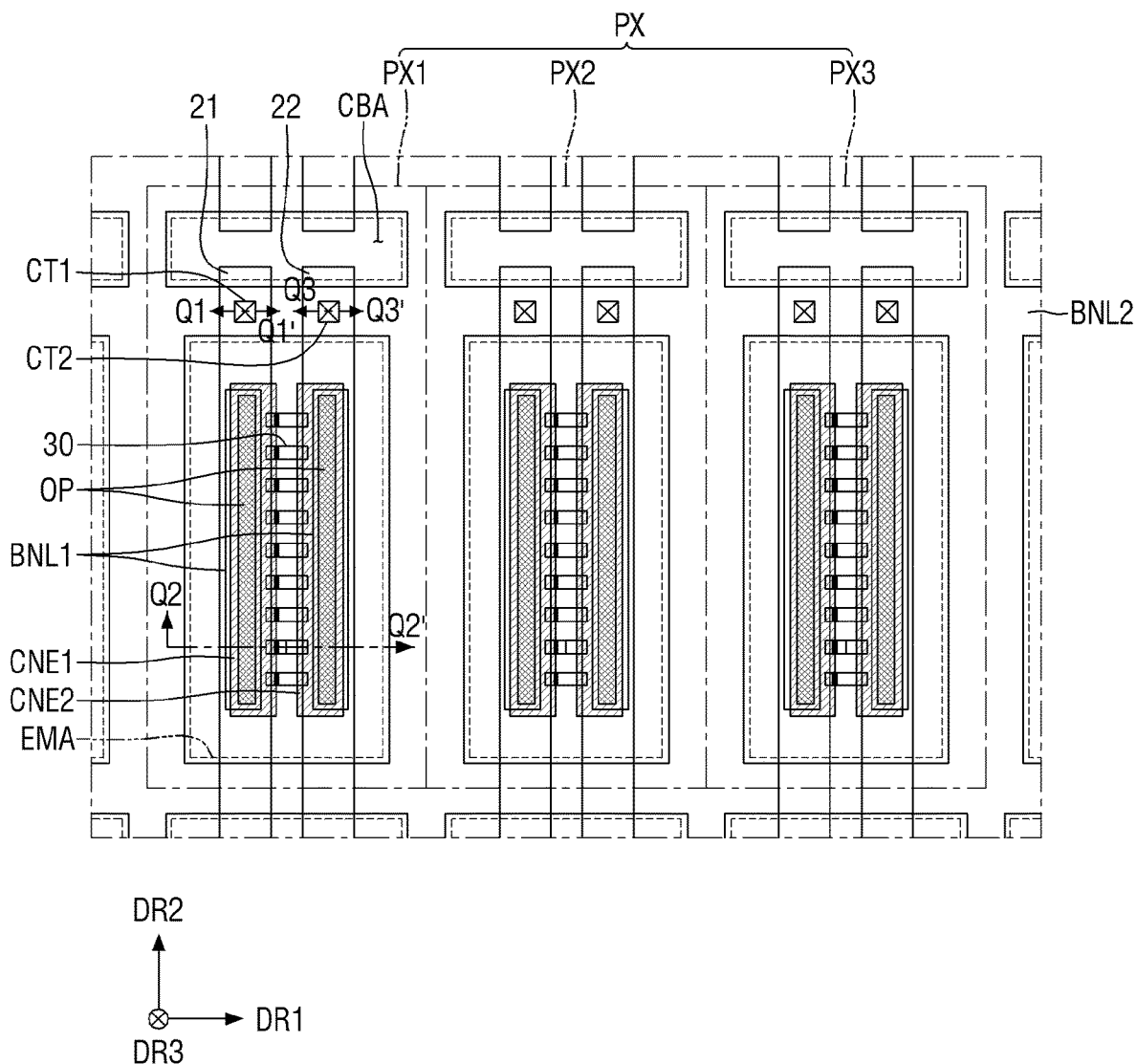
FIG. 3 is a plan view illustrating a pixel of a display device according to an embodiment.

FIG. 3 is a plan view illustrating a pixel of the display device according to an embodiment.

Referring to FIG. 3, each of the plurality of pixels PX may include a plurality of sub-pixels PXn (where n is an integer of 1 to 3). For example, one pixel PX may include a first sub-pixel PX1, a second sub-pixel PX2, and a third sub-pixel PX3. The first sub-pixel PX1, the second sub-pixel PX2, and the third sub-pixel PX3 may emit the light of the third color. For example, each of the first sub-pixel PX1, the second sub-pixel PX2, and the third sub-pixel PX3 may emit the blue light. However, the present disclosure is not limited thereto, and the first sub-pixel PX1 may emit the light of the first color, the second sub-pixel PX2 may emit the light of the second color, and the third sub-pixel PX3 may emit the light of the third color. For example, the first color may be blue, the second color may be green, and the third color may be red. Further, although an example in which FIG. 3 illustrates that the pixels PX include three sub-pixels PXn is described, the present disclosure is not limited thereto, and the pixels PX may include a larger number of sub-pixels PXn.

Each of the sub-pixels PXn of the display device 10 may include a light emitting part EMA and a non-light emitting part. The light emitting part EMA may be a region in which the light emitting element 30 is disposed to emit light of a specific wavelength band, and the non-light emitting part may be a region in which the light emitting element 30 is not disposed and the light emitted from the light emitting element 30 does not reach, and, thus, the light is not emitted therefrom. The light emitting part EMA may include a region where the light emitting element 30 is disposed and may include a region adjacent to the light emitting element 30 and to which the light emitted from the light emitting element 30 is emitted.

In addition, the light emitting part EMA may also include a region where the light emitted from the light emitting element 30 is reflected or refracted by another member to be emitted. A plurality of light emitting elements 30 may be disposed in each sub-pixel PXn, and the light emitting part may be formed by including a region where the light emitting elements 30 are disposed and a region adjacent thereto. The light emitting part EMA may correspond to the above-described light emitting regions LA1, LA2, and LA3, and the non-light emitting part may correspond to the above-described light blocking regions BA1, BA2, and BA3.

In an embodiment, each sub-pixel PXn may include a cut-out portion CBA disposed in the non-light emitting part. The cut-out portion CBA may be disposed on a side of the light emitting part EMA in the second direction DR2. The cut-out portion CBA may be disposed between the light emitting parts EMA of the sub-pixels PXn adjacent to each other in the second direction DR2. The plurality of light emitting parts EMA and the cut-out portions CBA may be arranged in the display region DPA of the display device 10. For example, the plurality of light emitting parts EMA and the cut-out portions CBA are repeatedly arranged in the first direction DR1, respectively, and the light emitting parts EMA and the cut-out portions may be alternately arranged in the second direction DR2. In an embodiment, a separation interval between the cut-out portions CBA in the first direction DR1 may be smaller than a separation interval between the light emitting parts EMA in the first direction DR1. The second pattern BNL2 may be disposed between the cut-out portions CBA and the light emitting parts EMA, and intervals therebetween may vary according to a width of the second pattern BNL2. Since the light emitting elements 30 are not disposed in the cut-out portion CBA, the light is not emitted, but some of electrodes 21 and 22 disposed in each sub-pixel PXn may be disposed. The electrodes 21 and 22 disposed in each sub-pixel PXn may be disposed to be separated from each other at the cut-out portion CBA.

Figure 4:
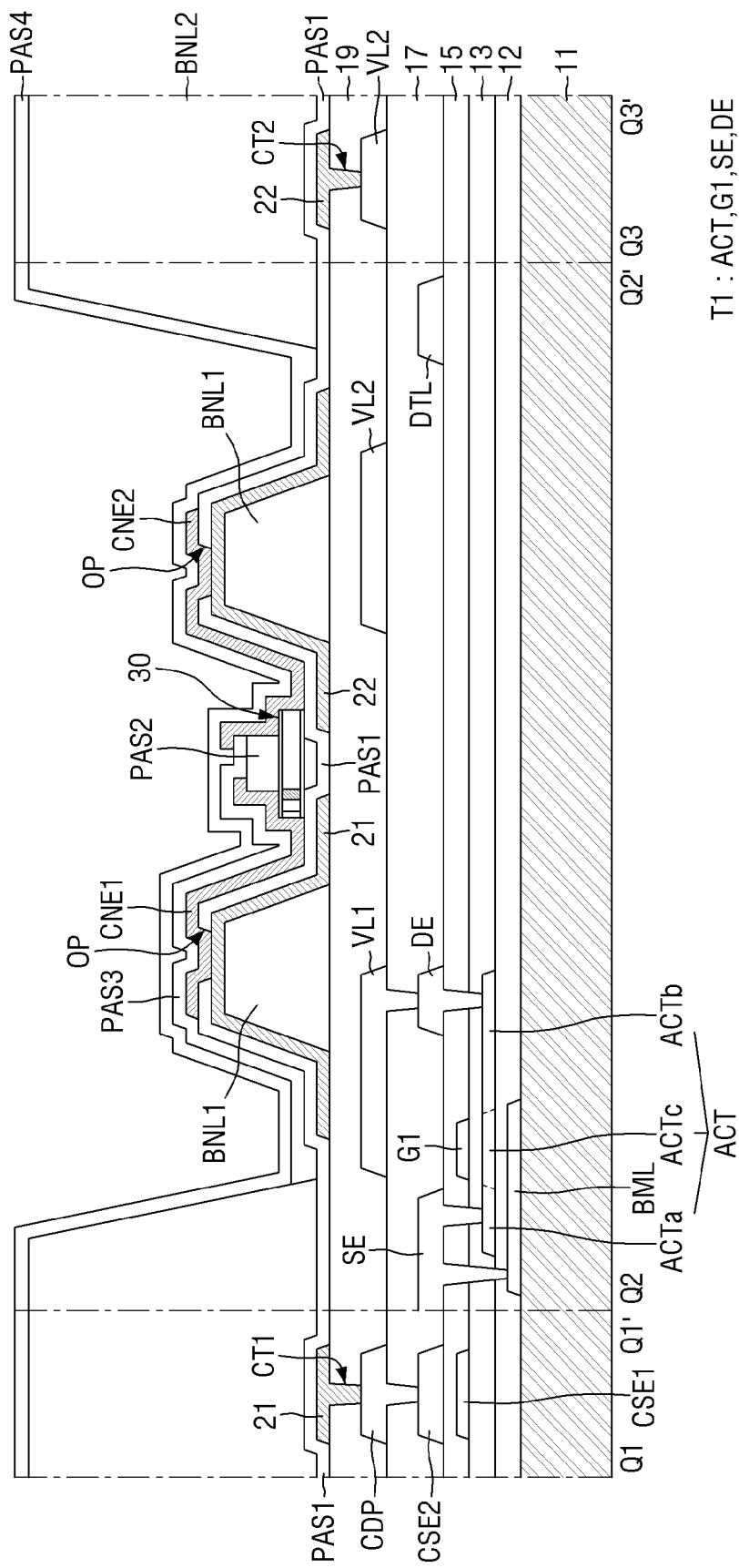
FIG. 4 is a cross-sectional view taken along the lines Q1-Q1', Q2-Q2', and Q3-Q3' in FIG. 3.

FIG. 4 is a cross-sectional view taken along the lines Q1-Q1', Q2-Q2', and Q3-Q3' in FIG. 3. FIG. 4 illustrates a cross-section which intersects both ends of the light emitting element 30 disposed in the first sub-pixel PX1 in FIG. 3.

Referring to FIG. 4 in conjunction with FIG. 3, the display device 10 may include the substrate 11 and a semiconductor layer, a plurality of conductive layers, and a plurality of insulating layers disposed on the substrate 11. Each of the semiconductor layer, the conductive layers, and the insulating layers may constitute a circuit layer and a light emitting element layer of the display device 10.

A light blocking layer BML may be disposed on the substrate 11. The light blocking layer BML may be disposed to overlap the active layer ACT of the first transistor T1 of the display device 10. The light blocking layer BML may include a material which blocks light and may prevent or substantially prevent light from being incident on the active layer ACT of the first transistor T1. For example, the light blocking layer BML may be formed of an opaque metallic material which blocks the transmission of light. However, the present disclosure is not limited thereto, and, in some cases, the light blocking layer BML may be omitted. Further, the light blocking layer BML may be electrically connected to the source electrode SE to suppress a change in voltage of the transistor. In addition, the light blocking layer BML may be used as a line, such as a power line, a data line, a gate line, or the like.

In an embodiment, the buffer layer 12 may be disposed on an entirety of the substrate 11, including the light blocking layer BML. The buffer layer 12 may be formed on the substrate 11 to protect the first transistors T1 of the pixel PX from moisture penetrating through the substrate 11 vulnerable to moisture permeation, and may perform a surface planarization function. In an embodiment, the buffer layer 12 may be formed of a plurality of inorganic layers which are alternately stacked. For example, the buffer layer 12 may be formed as a multilayer in which inorganic layers including at least one of silicon oxide ($SiO_x$), silicon nitride ($SiN_x$), and silicon oxynitride ($SiO_xN_y$) are alternately stacked.

The semiconductor layer may be disposed on the buffer layer 12. The semiconductor layer may include the active layer ACT of the first transistor T1. These may be disposed so as to partially overlap the gate electrode G1 of a first gate conductive layer, which will be described later.

In the drawings, only the first transistor T1 among transistors included in the sub-pixels PXn of the display device 10 is shown, but the present disclosure is not limited thereto. The display device 10 may include a greater number of transistors. For example, the display device 10 may include two or three transistors in each sub-pixel PXn by further including one or more transistors in addition to the first transistor T1.

The semiconductor layer may include any of polycrystalline silicon, single crystal silicon, an oxide semiconductor, and the like. When the semiconductor layer includes an oxide semiconductor, each active layer ACT may include a plurality of conductive regions ACTa and ACTb and a channel region ACTc disposed therebetween. In an embodiment, the oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), or the like.

In another embodiment, the semiconductor layer may include polycrystalline silicon. The polycrystalline silicon may be formed by crystallizing amorphous silicon, and, in this case, the conductive regions of the active layer ACT may be doped regions doped with impurities.

The first gate insulating layer 13 may be disposed on the semiconductor layer and the buffer layer 12. The first gate insulating layer 13 may be disposed on the buffer layer 12, including the semiconductor layer. The first gate insulating layer 13 may function as a gate insulating layer of each transistor. The first gate insulating layer 13 may be formed of an inorganic layer, for example, an inorganic layer including an inorganic material, such as any of silicon oxide ($SiO_x$), silicon nitride ($SiN_x$), and silicon oxynitride ($SiO_xN_y$) or may be formed in a stacked structure thereof.

The first gate conductive layer may be disposed on the first gate insulating layer 13. The first gate conductive layer may include the gate electrode G1 of the first transistor T1 and a first capacitance electrode CSE1 of a storage capacitor. The gate electrode G1 may be disposed to overlap the channel region ACTc of the active layer ACT in the thickness direction. The first capacitance electrode CSE1 may be disposed to overlap a second capacitance electrode CSE2, which will be described later, in the thickness direction. In an embodiment, the first capacitance electrode CSE1 may be connected to and integrated with the gate electrode G1. The first capacitance electrode CSE1 is disposed to overlap with the second capacitance electrode CSE2 in the thickness direction, and the storage capacitor may be formed therebetween.

The first gate conductive layer may be formed as a single layer or multiple layers formed of any of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The first interlayer insulating layer 15 may be disposed on the first gate conductive layer. The first interlayer insulating layer 15 may function as an insulating film between the first gate conductive layer and other layers disposed thereon. Further, the first interlayer insulating layer 15 may be disposed to cover the first gate conductive layer to protect the first gate conductive layer. In an embodiment, the first interlayer insulating layer 15 may be formed of an inorganic layer including any of inorganic materials such as silicon oxide ($SiO_x$), silicon nitride ($SiN_x$), and silicon oxynitride ($SiO_xN_y$) or may be formed in a stacked structure thereof.

A first data conductive layer may be disposed on the first interlayer insulating layer 15. The first data conductive layer may include the source electrode SE and the drain electrode DE of the first transistor T1, a data line DTL, and the second capacitance electrode CSE2.

The source electrode SE and the drain electrode DE of the first transistor T1 may respectively come into contact with the conductive regions ACTa and ACTb of the active layer ACT through a contact hole passing through the first interlayer insulating layer 15 and the first gate insulating layer 13. Further, the source electrode SE of the first transistor T1 may be electrically connected to the light blocking layer BML through another contact hole.

The data line DTL may apply a data signal to another transistor (not shown) included in the display device 10. Although not shown in the drawings, the data line DTL may be connected to source/drain electrodes of another transistor to transmit a signal applied from the data line DTL.

The second capacitance electrode CSE2 may be disposed to overlap the first capacitance electrode CSE1 in the thickness direction. In an embodiment, the second capacitance electrode CSE2 may be integrated with and connected to the source electrode SE.

The first data conductive layer may be formed as a single layer or multiple layers formed of any of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The second interlayer insulating layer 17 may be disposed on the first data conductive layer. The second interlayer insulating layer 17 may function as an insulating film between the first data conductive layer and other layers disposed thereon. Further, the second interlayer insulating layer 17 may function to cover the first data conductive layer and protect the first data conductive layer. In an embodiment, the second interlayer insulating layer 17 may be formed of an inorganic layer including inorganic materials such as any of silicon oxide ($SiO_x$), silicon nitride ($SiN_x$), and silicon oxynitride ($SiO_xN_y$) or may be formed in a stacked structure thereof.

A second data conductive layer may be disposed on the second interlayer insulating layer 17. The second data conductive layer may include a first voltage line VL1, a second voltage line VL2, and a first conductive pattern CDP. A high potential voltage (or a first power supply voltage) supplied to the first transistor T1 may be applied to the first voltage line VL1, and a low potential voltage (or a second power supply voltage) supplied to the second electrode 22 may be applied to the second voltage line VL2. Further, an alignment signal required to align the light emitting elements 30 may be applied to the second voltage line VL2 during a manufacturing process of the display device 10.

The first conductive pattern CDP may be connected to the second capacitance electrode CSE2 through a contact hole formed in the second interlayer insulating layer 17. The second capacitance electrode CSE2 may be integrated with the source electrode SE of the first transistor T1, and the first conductive pattern CDP may be electrically connected to the source electrode SE. The first conductive pattern CDP also comes into contact with the first electrode 21 which will be described later, and the first transistor T1 may transmit the first power supply voltage applied from the first voltage line VL1 to the first electrode 21 through the first conductive pattern CDP. The drawing illustrates that the second data conductive layer includes one second voltage line VL2 and one first voltage line VL1, but the present disclosure is not limited thereto. The second data conductive layer may include a larger number of first voltage lines VL1 and second voltage lines VL2. In an embodiment, the first data conductive layer may serve to transmit a signal such as a power supply voltage, and, in this case, the second data conductive layer may be omitted.

The second data conductive layer may be formed as a single layer or multiple layers formed of any of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The first planarization layer 19 may be disposed on the second data conductive layer. In an embodiment, the first planarization layer 19 may include an organic insulating material, for example, an organic material, such as polyimide (PI), and may perform a surface planarization function.

A plurality of first patterns BNL1, a plurality of electrodes 21 and 22, the light emitting element 30, a plurality of connection electrodes CNE1 and CNE2, and second patterns BNL2 may be disposed on the first planarization layer 19. Further, a plurality of insulating layers PAS1, PAS2, PAS3, and PAS4 may be disposed on the first planarization layer 19.

In an embodiment, the plurality of first patterns BNL1 may be directly disposed on the first planarization layer 19. The plurality of first patterns BNL1 each have a shape extending in the second direction DR2 in each sub-pixel PXn, do not extend to the other adjacent sub-pixel PXn in the second direction DR2, and may be disposed in the light emitting part EMA. Further, the plurality of first patterns BNL1 may be disposed to be spaced apart from each other in the first direction DR1, and the light emitting element 30 may be disposed therebetween. In an embodiment, the plurality of first patterns BNL1 may be disposed in each sub-pixel PXn to form a linear pattern in the display region DPA of the display device 10. In the drawings, two first patterns BNL1 are shown, but the present disclosure is not limited thereto. A larger number of first patterns BNL1 may be disposed depending on the number of electrodes 21 and 22.

Each of the first patterns BNL1 may have a structure in which at least a portion thereof protrudes from an upper surface of the first planarization layer 19. In an embodiment, the protruding portion of each of the first patterns BNL1 may have an inclined side surface, and the light emitted from the light emitting element 30 may be reflected from the electrodes 21 and 22 disposed on the first patterns BNL1 and then may be emitted in an upward direction of the planarization layer 19. Each of the first patterns BNL1 may serve as a reflection partition wall which provides a region where the light emitting element 30 is disposed and reflects the light emitted from the light emitting element 30 upward. The side surface of each of the first patterns BNL1 may be inclined in a linear shape, but the present disclosure is not limited thereto, and each of the first patterns BNL1 may have an outer surface of a curved semicircular or semi-elliptical shape. In an embodiment, the first patterns BNL1 may each include an organic insulating material, such as polyimide (PI), but are not limited thereto.

The plurality of electrodes 21 and 22 may be disposed on the first patterns BNL1 and the first planarization layer 19. The plurality of electrodes 21 and 22 may include a first electrode 21 and a second electrode 22. The first electrode 21 and the second electrode 22 may extend in the second direction DR2 and may be disposed to be spaced apart from each other in the first direction DR1.

Each of the first electrode 21 and the second electrode 22 may extend in the second direction DR2 in the sub-pixel PXn but may be separated from other electrodes 21 and 22 at the cut-out portion CBA. For example, the cut-out portion CBA may be disposed between the light emitting parts EMA of the sub-pixels PXn which are adjacent to each other in the second direction DR2, and the first electrode 21 and the second electrode 22 may be separated from the other first electrode 21 and second electrode 22 disposed in the sub-pixel PXn adjacent in the second direction DR2 in the cut-out portion CBA. However, the present disclosure is not limited thereto, and some of the electrodes 21 and 22 may not be separated in each sub-pixel PXn and may be disposed to extend beyond the sub-pixel PXn adjacent in the second direction DR2, or only one electrode of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may come into contact with the first conductive pattern CDP through the first contact hole CT1 passing through the first planarization layer 19 at a portion of the second pattern BNL2 extending in the first direction DR1. The second electrode 22 may come into contact with the second voltage line VL2 through the second contact hole CT2 passing through the first planarization layer 19 at a portion of the second pattern BNL2 extending in the first direction DR1. However, the present disclosure is not limited thereto. In another embodiment, the first contact hole CT1 and the second contact hole CT2 may be disposed in the light emitting part EMA surrounded by the second pattern BNL2 so as not to overlap the second pattern BNL2. In still another embodiment, the second electrode 22 may come into direct contact with the first data line layer to apply a voltage.

In the drawings, an example in which one first electrode 21 and one second electrode 22 are disposed in each sub-pixel PXn is illustrated, but the present disclosure is not limited thereto, and the number of first electrodes 21 and second electrodes 22 disposed in each sub-pixel PXn may be greater. Further, the first electrode 21 and the second electrode 22 disposed in each sub-pixel PXn may not necessarily have shapes extending in one direction, and the first electrode 21 and the second electrode 22 may be disposed in various structures. For example, the first electrode 21 and the second electrode 22 may each have a partially curved or bent shape, and one electrode may be disposed to surround the other electrode.

In an embodiment, each of the first electrode 21 and the second electrode 22 may be directly disposed on the first patterns BNL1. In an embodiment, each of the first electrode 21 and the second electrode 22 may be formed to have a larger width than the first pattern BNL1. For example, each of the first electrode 21 and the second electrode 22 may be disposed to cover outer surfaces of the first patterns BNL1. The first electrode 21 and the second electrode 22 may be respectively disposed on side surfaces of the first patterns BNL1, and an interval between the first electrode 21 and the second electrode 22 may be smaller than an interval between the first patterns BNL1. Further, since at least some regions of the first electrode 21 and the second electrode 22 may be disposed directly on the first planarization layer 19, the first electrode 21 and the second electrode 22 may be disposed on the same plane. However, the present disclosure is not limited thereto. In some cases, each of the electrodes 21 and 22 may have a width smaller than that of the first pattern BNL1. In an embodiment, however, each of the electrodes 21 and 22 may be disposed to cover at least one side surface of the first pattern BNL1 to reflect the light emitted from the light emitting element 30.

Each of the electrodes 21 and 22 may include a conductive material having a high reflectivity. For example, each of the electrodes 21 and 22 may include an alloy including a metal, such as silver (Ag), copper (Cu), aluminum (Al), or the like, as a material having a high reflectivity or including aluminum (Al), nickel (Ni), lanthanum (La), or the like. Each of the electrodes 21 and 22 may reflect the light emitted from the light emitting element 30 and proceeding toward the side surface of the first pattern BNL1 in an upward direction of each sub-pixel PXn.

However, the present disclosure is not limited thereto, and each of the electrodes 21 and 22 may further include a transparent conductive material. For example, each of the electrodes 21 and 22 may include a material such as indium tin oxide (ITO), indium zinc oxide (IZO), indium tin-zinc oxide (ITZO), or the like. In some embodiments, each of the electrodes 21 and 22 may have a structure in which one or more layers of a transparent conductive material and a metal layer having a high reflectivity are stacked or may be formed as one layer including the above. For example, each of the electrodes 21 and 22 may have a stacked structure, such as ITO/silver (Ag)/ITO/, ITO/Ag/IZO, ITO/Ag/ITZO/IZO, or the like.

The plurality of electrodes 21 and 22 may be electrically connected to the light emitting elements 30, and a voltage (e.g., a predetermined voltage) may be applied such that the light emitting elements 30 emit light. The plurality of electrodes 21 and 22 may be electrically connected to the light emitting elements 30 through the connection electrodes CNE1 and CNE2, and electrical signals applied to the electrodes 21 and 22 may be transmitted to the light emitting elements 30 through the connection electrodes CNE1 and CNE2.

One of the first electrode 21 and the second electrode 22 may be electrically connected to an anode of the light emitting element 30, and the other may be electrically connected to a cathode of the light emitting element 30. However, the present disclosure is not limited thereto, and the opposite case is also possible.

In an embodiment, the electrodes 21 and 22 may be used to form an electric field in the sub-pixel PXn to align the light emitting elements 30. The light emitting elements 30 may be disposed between the first electrode 21 and the second electrode 22 by the electric field formed on the first electrode 21 and the second electrode 22. In an embodiment, the light emitting elements 30 of the display device 10 may be sprayed onto the electrodes 21 and 22 through an inkjet printing process. When ink including the light emitting elements 30 is sprayed onto the electrodes 21 and 22, the electric field is generated by applying an alignment signal to the electrodes 21 and 22. The light emitting elements 30 dispersed in the ink may be aligned on the electrodes 21 and 22 by receiving a dielectrophoretic force by the electric field generated on the electrodes 21 and 22.

A first insulating layer PAS1 may be disposed on the first planarization layer 19. The first insulating layer PAS1 may be disposed to cover the first patterns BNL1 and the first and second electrodes 21 and 22. The first insulating layer PAS1 may protect the first electrode 21 and the second electrode 22 and insulate the first electrode 21 and the second electrode 22 from each other. Further, it is possible to prevent or substantially prevent the light emitting elements 30 disposed on the first insulating layer PAS1 from being damaged due to direct contact with other members.

In an embodiment, the first insulating layer PAS1 may include openings OP partially exposing the first electrode 21 and the second electrode 22. The openings OP may partially expose portions of the electrodes 21 and 22 disposed on upper surfaces of the first patterns BNL1. Portions of the connection electrodes CNE1 and CNE2 may respectively come into contact with the electrodes 21 and 22 exposed through the openings OP.

In an embodiment, the first insulating layer PAS1 may have a step formed between the first electrode 21 and the second electrode 22 such that a portion of an upper surface is recessed. For example, since the first insulating layer PAS1 is disposed to cover the first electrode 21 and the second electrode 22, the upper surface thereof may have a step according to shapes of the electrodes 21 and 22 disposed under the first insulating layer PAS1. However, the present disclosure is not limited thereto.

The second pattern BNL2 may be disposed on the first insulating layer PAS1. In an embodiment, the second pattern BNL2 may be disposed in a lattice pattern on the entire surface of the display region DPA, including portions extending in the first direction DR1 and the second direction DR2 in a plan view. The second pattern BNL2 may be disposed across a boundary of the sub-pixels PXn to distinguish adjacent sub-pixels PXn.

In an embodiment, the second pattern BNL2 may be disposed to surround the light emitting part EMA and the cut-out portion CBA disposed in each sub-pixel PXn to distinguish the light emitting part EMA and the cut-out portion CBA. The first electrode 21 and the second electrode 22 may extend in the second direction DR2 and may be disposed across a portion of the second pattern BNL2 extending in the first direction DR1. In an embodiment, the portion of the second pattern BNL2 extending in the second direction DR2 disposed between the light emitting parts EMA may have a larger width than a portion disposed between the cut-out portions CBA. Accordingly, an interval between the cut-out portions CBA may be smaller than an interval between the light emitting parts EMA.

In an embodiment, the second pattern BNL2 may be formed to have a height greater than that of the first pattern BNL1. The second pattern BNL2 may prevent or substantially prevent ink from overflowing to an adjacent sub-pixel PXn in the inkjet printing process of the manufacturing process of the display device 10 to separate the ink in which different light emitting elements 30 are dispersed for different sub-pixels PXn such that the ink may not be mixed. In an embodiment, the second pattern BNL2 may include polyimide (PI) like the first pattern BNL1, but is not limited thereto.

The light emitting element 30 may be disposed on the first insulating layer PAS1. The plurality of light emitting elements 30 may be disposed to be spaced apart from each other along the second direction DR2 in which the electrodes 21 and 22 extend and may be substantially aligned to be parallel with each other. Each of the light emitting elements 30 may have a shape extending in a direction, and, in an embodiment, the direction in which the electrodes 21 and 22 extend and the direction in which the light emitting elements 30 extend may substantially form a right angle. However, the present disclosure is not limited thereto, and the light emitting elements 30 may be disposed not to be perpendicular but to be inclined to the direction in which the electrodes 21 and 22 extend.

In an embodiment, the light emitting elements 30 disposed in each sub-pixel PXn may each include a light-emitting layer 36 (see FIG. 5) including different materials to emit light of different wavelength bands to the outside. Accordingly, light of a first color, light of a second color, and light of a third color may be emitted from the first sub-pixel PX1, the second sub-pixel PX2, and the third sub-pixel PX3, respectively. However, the present disclosure is not limited thereto, and each of the sub-pixels PXn may include the light emitting elements 30 of the same type and may emit light of substantially the same color.

Both ends of each of the light emitting elements 30 may be disposed on the electrodes 21 and 22 between the first patterns BNL1. In an embodiment, an extending length of the light emitting element 30 may be longer than the interval between the first electrode 21 and the second electrode 22, and both ends of the light emitting element 30 may be respectively disposed on the first electrode 21 and the second electrode 22. For example, the light emitting element 30 may be disposed such that a first end thereof is disposed on the first electrode 21 and a second end thereof is disposed on the second electrode 22.

In the light emitting element 30, a plurality of layers may be disposed in a direction perpendicular to the substrate 11 or the upper surface of the first planarization layer 19. In an embodiment, the light emitting element 30 may be disposed such that an extending direction becomes parallel to the upper surface of the first planarization layer 19, and a plurality of semiconductor layers included in the light emitting element 30 may be sequentially disposed along the direction parallel to the upper surface of the first planarization layer 19. However, the present disclosure is not limited thereto, and when the light emitting element 30 has a different structure, the plurality of semiconductor layers may be disposed in the direction perpendicular to the upper surface of the first planarization layer 19.

Both ends of the light emitting element 30 may respectively come into contact with the connection electrodes CNE1 and CNE2. For example, in the light emitting element 30, an insulating film 38 (see FIG. 5) is not formed on an end surface in an extending direction, portions of semiconductor layers 31 and 32 (see FIG. 5) or an electrode layer 37 (see FIG. 5) may be exposed, and the exposed semiconductor layers 31 and 32 or the exposed electrode layer 37 may come into contact with the connection electrodes CNE1 and CNE2. However, the present disclosure is not limited thereto, and, in the light emitting element 30, since at least a portion of the insulating film 38 is removed to partially expose both end side surfaces of the semiconductor layers 31 and 32, the exposed side surfaces of the semiconductor layers 31 and 32 may directly come into contact with the connection electrodes CNE1 and CNE2.

A second insulating layer PAS2 may be disposed on a portion of the light emitting element 30. For example, the second insulating layer PAS2 may be disposed on the light emitting element 30 with a width smaller than a length of the light emitting element 30 such that the light emitting element 30 is surrounded and both ends of the light emitting element 30 are exposed. In an embodiment, the second insulating layer PAS2 may be disposed to cover the light emitting element 30, the electrodes 21 and 22, and the first insulating layer PAS1 during the manufacturing process of the display device 10 and then may be removed to expose both ends of the light emitting element 30. In an embodiment, since the second insulating layer PAS2 may be disposed on the first insulating layer PAS1 to extend in the second direction DR2 in a plan view, a linear or island-shaped pattern may be formed in each sub-pixel PXn. The second insulating layer PAS2 may protect the light emitting element 30 and fix the light emitting element 30 in the manufacturing process of the display device 10.

The plurality of connection electrodes CNE1 and CNE2 and a third insulating layer PAS3 may be disposed on the second insulating layer PAS2.

The plurality of connection electrodes CNE1 and CNE2 may each have a shape extending in a direction and may be respectively disposed on the electrodes 21 and 22. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from or opposite to each other. For example, the first connection electrode CNE1 and the second connection electrode CNE2 may be respectively disposed on the first electrode 21 and the second electrode 22 and may be spaced apart from each other in the first direction DR1. In an embodiment, each of the connection electrodes CNE1 and CNE2 may form a stripe pattern in the light emitting part EMA of each sub-pixel PXn.

Each of the plurality of connection electrodes CNE1 and CNE2 may come into contact with the light emitting elements 30. The first connection electrode CNE1 may come into contact with a first end portion of the light emitting element 30, and the second connection electrode CNE2 may come into contact with a second end portion of the light emitting element 30. The semiconductor layers may be exposed at both end surfaces of the light emitting element 30 in the extending direction, and the connection electrodes CNE1 and CNE2 may come into contact with the semiconductor layers of the light emitting element 30 to be electrically connected thereto. Sides of the connection electrodes CNE1 and CNE2 which come into contact with both ends of the light emitting element 30 may be disposed on the second insulating layer PAS2. Further, the first connection electrode CNE1 may come into contact with the first electrode 21 through the opening OP which exposes a portion of an upper surface of the first electrode 21, and the second connection electrode CNE2 may come into contact with the second electrode 22 through the opening OP which exposes a portion of an upper surface of the electrode 22.

In an embodiment, the connection electrodes CNE1 and CNE2 may have a width measured in a direction that is less than a width measured in the direction of the electrodes 21 and 22, respectively. The connection electrodes CNE1 and CNE2 may be disposed to come into contact with a first end portion and a second end portion of the light emitting element 30 and cover portions of the upper surfaces of the first electrode 21 and the second electrode 22, respectively. However, the present disclosure is not limited thereto, and the connection electrodes CNE1 and CNE2 may have widths greater than those of the electrodes 21 and 22 and may cover both side surfaces of the electrodes 21 and 22.

The connection electrodes CNE1 and CNE2 may include a transparent conductive material. For example, the connection electrodes CNE1 and CNE2 may include any of ITO, IZO, ITZO, aluminum (Al), and the like. The light emitted from the light emitting element 30 may pass through the connection electrodes CNE1 and CNE2 and proceed toward the electrodes 21 and 22. However, the present disclosure is not limited thereto.

The drawings illustrate that two connection electrodes CNE1 and CNE2 are disposed in one sub-pixel PXn, but the present disclosure is not limited thereto. The number of connection electrodes CNE1 and CNE2 may vary depending on the number of electrodes 21 and 22 disposed in each sub-pixel PXn.

The third insulating layer PAS3 may be disposed to cover the first connection electrode CNE1. The third insulating layer PAS3 may be disposed to cover a side at which the first connection electrode CNE1 is disposed with respect to the second insulating layer PAS2, including the first connection electrode CNE1. For example, the third insulating layer PAS3 may be disposed to cover the first connection electrode CNE1 and the first insulating layer PAS1 disposed on the first electrode 21. In an embodiment, such an arrangement may be formed by a process of entirely disposing an insulating material layer forming the third insulating layer PAS3 on the light emitting part EMA and then partially removing the insulating material layer to form the second connection electrode CNE2. In the process, the insulating material layer forming the third insulating layer PAS3 may be removed together with an insulating material layer forming the second insulating layer PAS2, and a side of the third insulating layer PAS3 may be aligned with a side of the second insulating layer PAS2. A side of the second connection electrode CNE2 may be disposed on the third insulating layer PAS3 and may be insulated from the first connection electrode CNE1 with the third insulating layer PAS3 interposed therebetween.

In an embodiment, a fourth insulating layer PAS4 may be disposed in an entirety of the display region DPA of the substrate 11. The fourth insulating layer PAS4 may function to protect members disposed on the substrate 11 from an external environment. However, the fourth insulating layer PAS4 may be omitted.

Each of the above-described first insulating layer PAS1, second insulating layer PAS2, third insulating layer PAS3, and fourth insulating layer PAS4 may include an inorganic insulating material or an organic insulating material. For example, each of the first insulating layer PAS1, the second insulating layer PAS2, the third insulating layer PAS3, and the fourth insulating layer PAS4 may include an inorganic insulating material, such as silicon oxide ($SiO_x$), silicon nitride ($SiN_x$), silicon oxynitride ($SiO_xN_y$), aluminum oxide ($Al_xO_y$), aluminum nitride (AlN), or the like. In another embodiment, these insulating layers may include an organic insulating material, such as an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, or the like. However, the present disclosure is not limited thereto.

Figure 5:
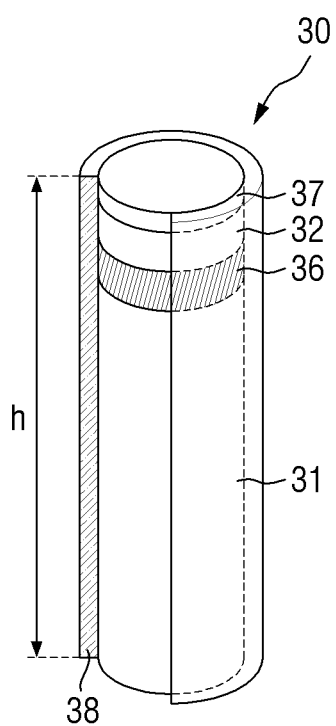
FIG. 5 is a schematic view of a light emitting element according to an embodiment.

FIG. 5 is a schematic view of a light emitting element according to an embodiment.

Referring to FIG. 5, the light emitting element 30 may be a particulate element and may have a rod shape or cylindrical shape having an aspect ratio (e.g., a predetermined aspect ratio). The light emitting element 30 may have a size on a nanometer scale (1 nm or more and less than 1 µm) to a micrometer scale (1 µm or more and less than 1 mm). In an embodiment, both the diameter and the length of the light emitting element 30 may have sizes on the nanometer scale or may have sizes on the micrometer scale. In another embodiment, the diameter of the light emitting element 30 may have a size on the nanometer scale, while the length of the light emitting element 30 may have a size on the micrometer scale. In an embodiment, some of the light emitting elements 30 have a diameter and/or length on the nanometer scale, while some other light emitting elements 30 have a diameter and/or length on the micrometer scale.

In an embodiment, the light emitting element 30 may be an inorganic light emitting diode. In an embodiment, the light emitting element 30 may include a semiconductor layer doped with an arbitrary conductive (for example, a p-type or an n-type) impurity. The semiconductor layer may receive an electric signal applied from an external power source to emit light in a specific wavelength band.

The light emitting element 30 according to an embodiment may include a first semiconductor layer 31, an active layer 36 (or light-emitting layer), a second semiconductor layer 32, and an electrode layer 37 sequentially stacked in a longitudinal direction. In an embodiment, the light emitting element may further include an insulating film 38 surrounding outer surfaces of the first semiconductor layer 31, the second semiconductor layer 32, and the active layer 36.

In an embodiment, the first semiconductor layer 31 may be an n-type semiconductor. In an embodiment, when the light emitting element 30 emits light in a blue wavelength band, the first semiconductor layer 31 may include a semiconductor material having a chemical formula of $Al_xGa_yIn_{1-x-y}N$ ($0<=x<=1$, $0<=y<=1$, and $0<=x+y<=1$). For example, the semiconductor material may include one or more among AlGaInN, GaN, AlGaN, InGaN, AlN, and InN doped to an n-type conductivity. In an embodiment, the first semiconductor layer 31 may be doped with an n-type dopant, and the n-type dopant may include Si, Ge, Sn, or the like. For example, the first semiconductor layer 31 may be n-GaN doped with Si as an n-type dopant. In an embodiment, a length of the first semiconductor layer 31 may be in a range from 1.5 µm to 5 µm, but is not limited thereto.

The second semiconductor layer 32 may be disposed on the light-emitting layer 36 which will be described later. In an embodiment, the second semiconductor layer 32 may be a p-type semiconductor, and when the light emitting element 30 emits light in a blue or green wavelength band, the second semiconductor layer 32 may include a semiconductor material having a chemical formula of $Al_xGa_yIn_{1-x-y}N$ ($0<=x<=1$, $0<=y<=1$, and $0<=x+y<=1$). For example, the semiconductor material may include one or more among AlGaInN, GaN, AlGaN, InGaN, AlN, and InN doped to a p-type conductivity. In an embodiment, the second semiconductor layer 32 may be doped with a p-type dopant, and the p-type dopant may include Mg, Zn, Ca, Se, Ba, or the like. For example, the second semiconductor layer 32 may be p-GaN doped with Mg as a p-type dopant. In an embodiment, a length of the second semiconductor layer 32 may be in a range from 0.05 µm to 0.10 µm, but is not limited thereto.

The drawing illustrates that the first semiconductor layer 31 and the second semiconductor layer 32 are configured as one layer, but the present disclosure is not limited thereto. Depending on the material of the light-emitting layer 36, the first semiconductor layer 31 and the second semiconductor layer 32 may further include a larger number of layers, for example, a clad layer or a tensile strain barrier reducing (TSBR) layer.

The light-emitting layer 36 may be disposed between the first semiconductor layer 31 and the second semiconductor layer 32. The light-emitting layer 36 may include a material having a single or multiple quantum well structure. When the light-emitting layer 36 includes a material having the multiple quantum well structure, the light-emitting layer 36 may have a structure in which a plurality of quantum layers and well layers may be alternately stacked. The light-emitting layer 36 may emit light by the combination of electron-hole pairs according to an electric signal applied through the first and second semiconductor layers 31 and 32. When the light-emitting layer 36 emits light in a blue wavelength band, the light-emitting layer 36 may include a material such as AlGaN, AlGaInN, or the like. In an embodiment, when the light-emitting layer 36 has a structure in which the quantum layers and the well layers are alternately stacked as the multiple quantum well structure, the quantum layer may include a material such as AlGaN, AlGaInN, or the like, and the well layer may include a material such as GaN, AlInN, or the like. For example, as the light-emitting layer 36 may include AlGaInN as the quantum layer and AlInN as the well layer, as described above, the light-emitting layer 36 may emit blue light having a central wavelength band in a range of 450 nm to 495 nm.

However, the present disclosure is not limited thereto, and the light-emitting layer 36 may have a structure in which semiconductor materials having large band gap energy and semiconductor materials having small band gap energy are alternately stacked with each other and may include groups III-V semiconductor materials which are different depending on the wavelength band of the emitted light. However, the light emitted from the light-emitting layer 36 is not limited to the light in the blue wavelength band, and, in some cases, light in a red or green wavelength band may be emitted. In an embodiment, a length of the light-emitting layer 36 may be in a range from 0.05 µm to 0.10 µm, but is not limited thereto.

In an embodiment, the light emitted from the light-emitting layer 36 may be emitted not only to an outer surface of the light emitting element 30 in the longitudinal direction, but also to both side surfaces. The light emitted from the light-emitting layer 36 is not limited in directionality to one direction.

In an embodiment, the electrode layer 37 may be an ohmic connection electrode. However, the present disclosure is not limited thereto, and, in another embodiment, the electrode layer 37 may be a Schottky connection electrode. The light emitting element 30 may include at least one electrode layer 37. FIG. 5 illustrates that the light emitting element 30 includes one electrode layer 37, but the present disclosure is not limited thereto. In some cases, the light emitting element 30 may include a larger number of electrode layers 37 or the electrode layer 37 may be omitted. The description of the light emitting element 30 which will be provided later may be equally applied even when the number of electrode layers 37 is changed or another structure is further included.

When the light emitting element 30 is electrically connected to an electrode or a connection electrode in the display device 10 according to an embodiment, the electrode layer 37 may reduce a resistance between the light emitting element 30 and the electrode or the connection electrode. The electrode layer 37 may include a conductive metal. For example, the electrode layer 37 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 37 may include a semiconductor material doped with an n-type or p-type dopant. The electrode layer 37 may include the same material or different materials but is not limited thereto.

The insulating film 38 may be disposed to surround outer surfaces of the above-described plurality of semiconductor layers and electrode layers. For example, the insulating film 38 may be disposed to surround at least an outer surface of the light-emitting layer 36 and may extend in a direction in which the light emitting element 30 extends. The insulating film 38 may perform a function of protecting the members. The insulating film 38 may be formed to surround side surface portions of the members, and both ends of the light emitting element 30 in the longitudinal direction may be formed to be exposed.

Although the drawing illustrates that the insulating film 38 is formed to extend in the longitudinal direction of the light emitting element 30 to cover from the first semiconductor layer 31 to a side surface of the electrode layer 37, the present disclosure is not limited thereto. In an embodiment, the insulating film 38 may cover only the outer surfaces of some of the semiconductor layers, including the light-emitting layer 36 or may cover only a portion of an outer surface of the electrode layer 37 to partially expose the outer surface of each electrode layer 37. In an embodiment, the insulating film 38 may have a rounded upper surface in a cross-section in a region adjacent to at least one end portion of the light emitting element 30.

In an embodiment, a thickness of the insulating film 38 may be in a range of 10 nm to 1.0 μm but is not limited thereto. In an embodiment, the thickness of the insulating film 38 may be approximately 40 nm.

The insulating film 38 may include any of materials having insulating properties, for example, silicon oxide ($SiO_x$), silicon nitride ($SiN_x$), silicon oxynitride ($SiO_xN_y$), aluminum nitride (AlN), aluminum oxide ($Al_xO_y$), and the like. The insulating film 38 may be formed as a single film or multiple films of materials having insulating properties. Accordingly, it is possible to prevent or substantially prevent an electrical short circuit which may occur when the light-emitting layer 36 directly comes into contact with the electrode through which the electric signal is transmitted to the light emitting element 30. Further, since the insulating film 38 protects the outer surface of the light emitting element 30, including the light-emitting layer 36, it is possible to prevent or substantially prevent degradation of light emitting efficiency.

In an embodiment, an outer surface of the insulating film 38 may be surface-treated. The light emitting elements 30 may be sprayed onto the electrode in a state of being dispersed in an ink (e.g., a predetermined ink) to be aligned. Here, in order to keep a state in which the light emitting elements 30 are dispersed in the ink without being aggregated with other light emitting elements 30 adjacent thereto, the surface of the insulating film 38 may be hydrophobic or hydrophilic. For example, the outer surface of the insulating film 38 may be surface-treated with a material such as stearic acid, 2,3-naphthalene dicarboxylic acid, or the like.

Figure 6:
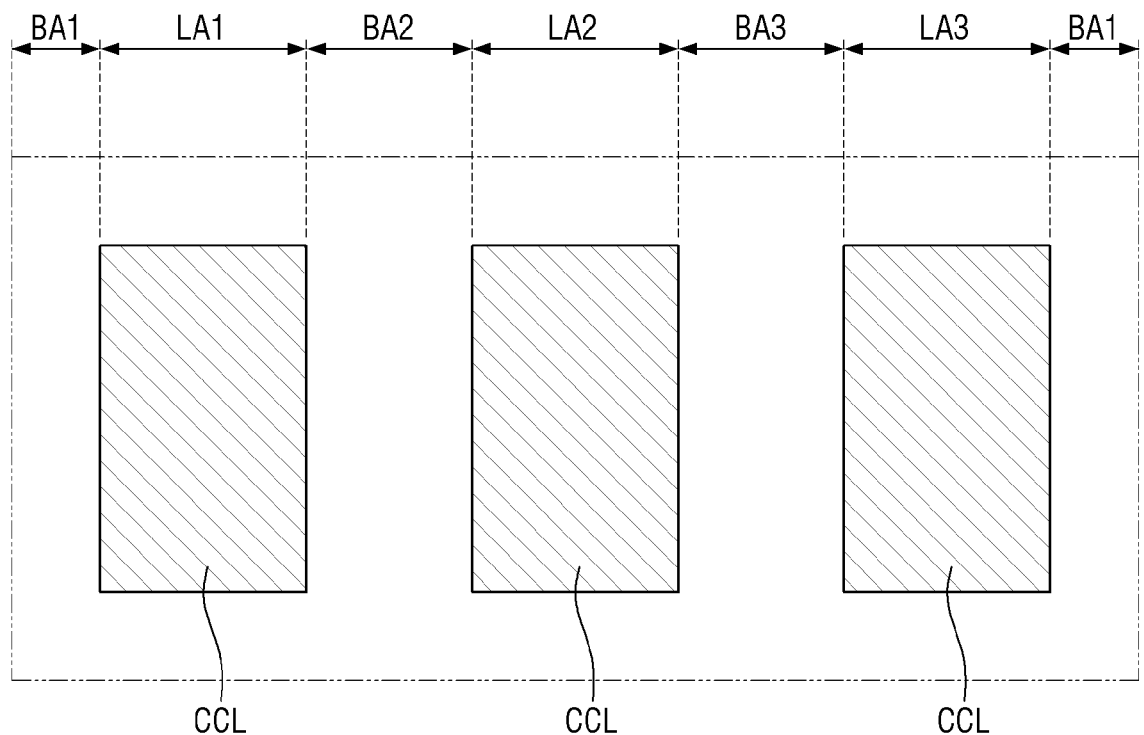
FIG. 6 is a plan view illustrating an arrangement of a color conversion member of a display device according to an embodiment.
Figure 7:
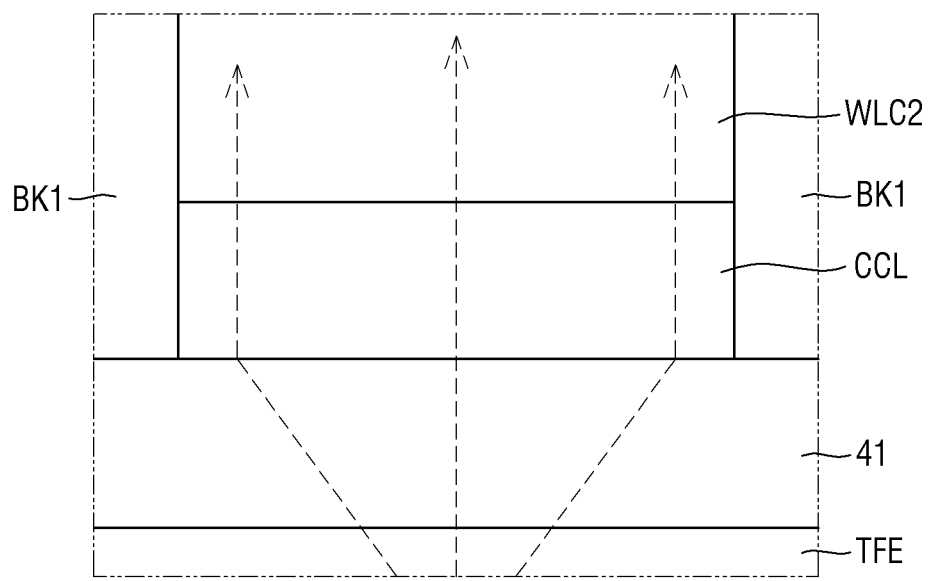
FIG. 7 is an enlarged view of a region "A" in FIG. 2.

FIG. 6 is a plan view illustrating an arrangement of a color conversion member of the display device according to an embodiment; and FIG. 7 is an enlarged view of a region "A" in FIG. 2.

Referring to FIG. 6 in conjunction with FIG. 2, the display device 10 according to an embodiment may include the wavelength conversion layer WLCL including the color conversion member CCL. The color conversion member CCL may be disposed in the first to third light emitting regions LA1, LA2, and LA3 on the second planarization layer 41. The color conversion member CCL may overlap the first to third light emitting regions LA1, LA2, and LA3 and may not overlap the first to third light blocking regions BA1, BA2, and BA3.

The color conversion member CCL may absorb external light incident from the outside through the first color filter CF1 or the light transmitting part LTU to reduce reflection of the external light. To this end, the color conversion member CCL may be disposed to overlap with the first color filter CF1. For example, the color conversion member CCL may be disposed to overlap with the first color filter CF1 and the first wavelength conversion part WLC1 of the first light emitting region LA1. Further, the color conversion member CCL may be disposed to overlap with the first color filter CF1 and the second wavelength conversion part WLC2 of the second light emitting region LA2. Also, the color conversion member CCL may be disposed to overlap with the light transmitting part LTU of the third light emitting region LA3.

The color conversion member CCL may be disposed between the second planarization layer 41 and the first wavelength conversion part WLC1 in the first light emitting region LA1, may be disposed between the second planarization layer 41 and the second wavelength conversion part WLC2 in the second light emitting region LA2, and may be disposed between the second planarization layer 41 and the light transmitting part LTU in the third light emitting region LA3. That is, the color conversion member CCL may be disposed closer to the light emitting element 30 of the light emitting element layer EML than the first wavelength conversion part WLC1, the second wavelength conversion part WLC2, and the light transmitting part LTU.

The color conversion member CCL may transmit light of a third color (for example, blue light) and block light of other colors, such as red light and green light. For example, the color conversion member CCL may be formed of a blue color filter. The color conversion member CCL may transmit light having the same color as the light emitted from the light emitting element 30 of the light emitting element layer EML. For example, the light emitting element 30 may emit the blue light which is the light of the third color, and the color conversion member CCL may transmit the blue light which is the light of the third color. Accordingly, it is possible to reduce the reflection of the external light by transmitting the blue light provided by the light emitting element 30 and absorbing the external light incident from the outside.

The color conversion member CCL may be disposed in a region partitioned by the first light blocking member BK1. In an embodiment, the color conversion member CCL is applied by inkjet printing in the first to third light emitting regions LA1, LA2, and LA3 partitioned by the first light blocking member BK1 and, thus, a mask process may be omitted.

In an embodiment, the first wavelength conversion part WLC1, the second wavelength conversion part WLC2, and the light transmitting part LTU may be applied by the inkjet printing after the color conversion member CCL is formed. When the color conversion member CCL is first formed by the inkjet printing, a surface of the color conversion member CCL may have a wetting characteristic. Accordingly, processability of the first wavelength conversion part WLC1, the second wavelength conversion part WLC2, and the light transmitting part LTU formed on the color conversion member CCL by the inkjet printing may be enhanced.

Referring to FIG. 7 in conjunction with FIG. 2, in an embodiment, the color conversion member CCL may be disposed on the second planarization layer 41. A lower surface of the color conversion member CCL may be disposed to come into contact with the upper surface of the second planarization layer 41. Each of the color conversion member CCL and the second planarization layer 41 may have a certain refractive index (e.g., a predetermined refractive index). In an embodiment, a refractive index of the color conversion member CCL may be greater than a refractive index of the second planarization layer 41.

The blue light provided from the light emitting element layer EML may pass through the encapsulation layer TFE and may be incident on the color conversion member CCL through the second planarization layer 41. In an embodiment, since the color conversion member CCL and the second planarization layer 41 have different refractive indices, changes in proceeding paths such as refraction, reflection, transmission, and the like of the blue light occur at the interface between the color conversion member CCL and the second planarization layer 41. In an embodiment, the refractive index of the color conversion member CCL may be greater than the refractive index of the second planarization layer 41. Among the blue light passing through the second planarization layer 41, the light which is incident perpendicular to the interface between the color conversion member CCL and the second planarization layer 41 may pass through the color conversion member CCL without changing the path. In an embodiment, since the color conversion member CCL has a relatively large refractive index, the light may be refracted toward the color conversion member CCL. Further, among the blue light passing through the second planarization layer 41, the light which is incident at an angle to the interface between the color conversion member CCL and the second planarization layer 41 may be refracted in the direction of the color conversion member CCL having a large refractive index and may be concentrated. Accordingly, since the refractive index of the color conversion member CCL is greater than the refractive index of the second planarization layer 41, it is possible to enhance the light emitting efficiency of the blue light emitted from the light emitting element layer EML.

Figure 8:
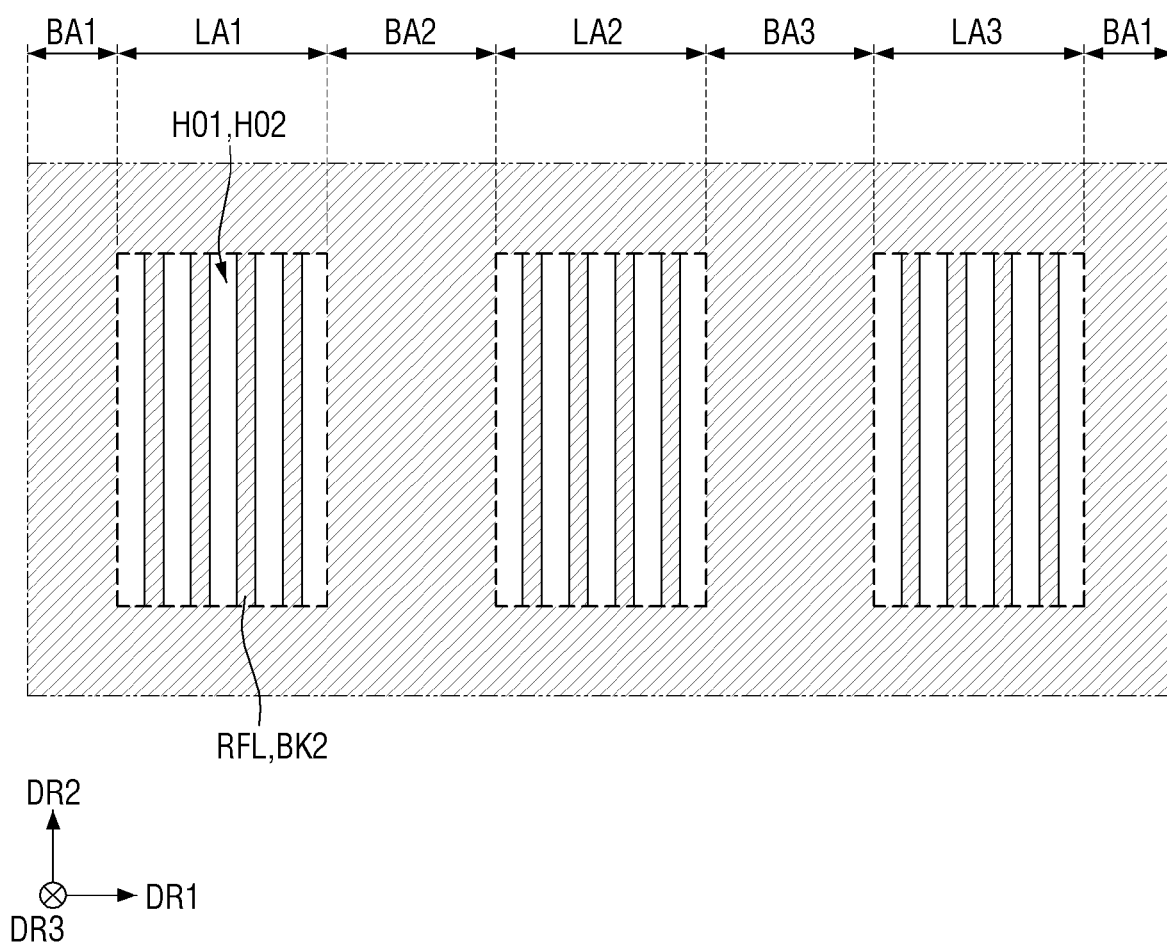
FIGS. 8 to 10 are plan views illustrating various shapes of a reflection layer and a second light blocking member according to some embodiments.
Figure 9:
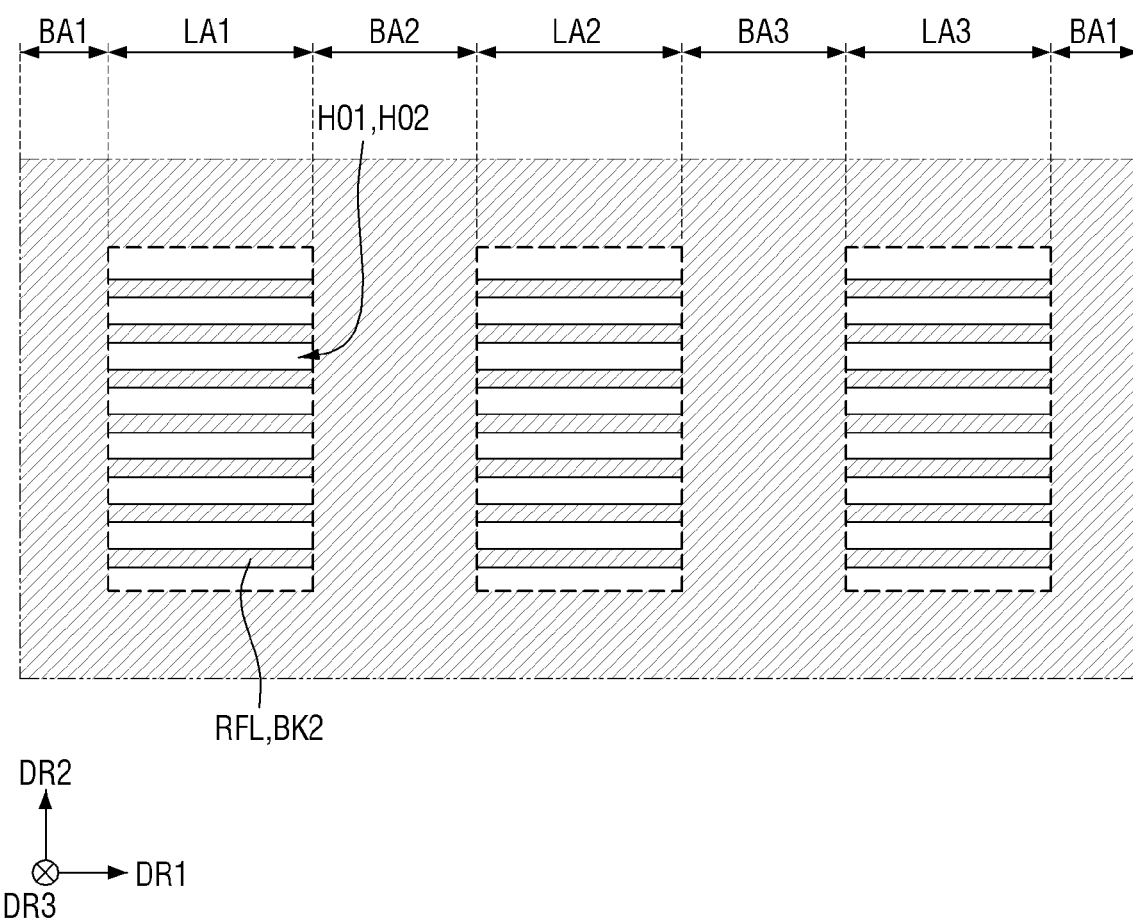
Figure 10:
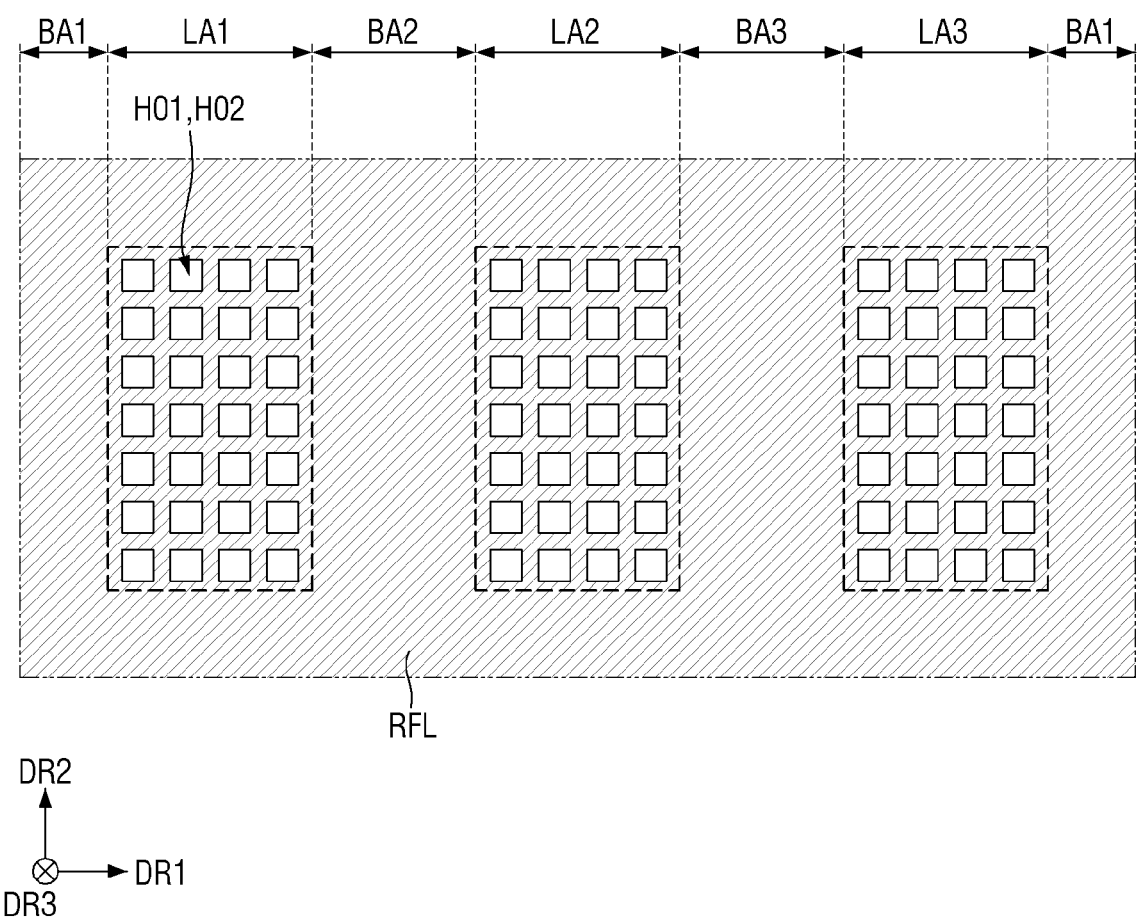

FIGS. 8 to 10 are plan views illustrating various shapes of the reflection layer and the second light blocking member according to some embodiments.

Referring to FIGS. 8 to 10 in conjunction with FIG. 2, as described above, the reflection layer RFL and the second light blocking member BK2 may be disposed on the first capping layer CAP1 in the first to third light emitting regions LA1, LA2, and LA3 and the first to third light blocking regions BA1, BA2, and BA3. The reflection layer RFL may include the plurality of first holes HO1 overlapping the first to third light emitting regions LA1, LA2, and LA3. Like the reflection layer RFL, the second light blocking member BK2 may include the plurality of second holes HO2 overlapping the first to third light emitting regions LA1, LA2, and LA3.

In an embodiment, the reflection layer RFL and the second light blocking member BK2 may overlap each other to have the same planar shape, and the first holes HO1 and the second holes HO2 may also overlap each other to have the same planar pattern shape. The light emitted from the light emitting element layer EML may be emitted to the outside through the first holes HO1 and the second holes HO2.

In an embodiment, the reflection layer RFL and the second light blocking member BK2 may be disposed in stripe shapes in each of the first to third light emitting regions LA1, LA2, and LA3. As shown in FIG. 8, in the first to third light emitting regions LA1, LA2, and LA3, the reflection layer RFL and the second light blocking member BK2 may extend in the second direction DR2 and may be disposed in the stripe shapes spaced apart from each other in the first direction DR1. The first holes HO1 and the second holes HO2 may also extend in the second direction DR2 and may be disposed in stripe shapes spaced apart from each other in the first direction DR1.

As shown in FIG. 9, in another embodiment, in the first to third light emitting regions LA1, LA2, and LA3, the reflection layer RFL and the second light blocking member BK2 may extend in the first direction DR1 and may be disposed in the stripe shapes spaced apart from each other in the second direction DR2. The first holes HO1 and the second holes HO2 may also extend in the first direction DR1 and may be disposed in stripe shapes spaced apart from each other in the second direction DR2.

As shown in FIG. 10, in another embodiment, in the first to third light emitting regions LA1, LA2, and LA3, the reflection layer RFL and the second light blocking member BK2 may have a mesh shape. The first holes HO1 and the second holes HO2 may be disposed in the shape of a plurality of quadrangular dots between the mesh-shaped reflection layer RFL and second light blocking member BK2 in a plan view. However, the present disclosure is not limited thereto, and the first holes HO1 and the second holes HO2 may be disposed in the shape of a plurality of dots of a polygonal shape other than a circular shape or quadrangular shape in a plan view.

As described above, the display device 10 according to an embodiment may include the color conversion member CCL between the wavelength conversion layers WLCL to reduce the reflection of the external light and enhance the light emitting efficiency of the blue light provided from the light emitting element layer EML.

Figure 11:
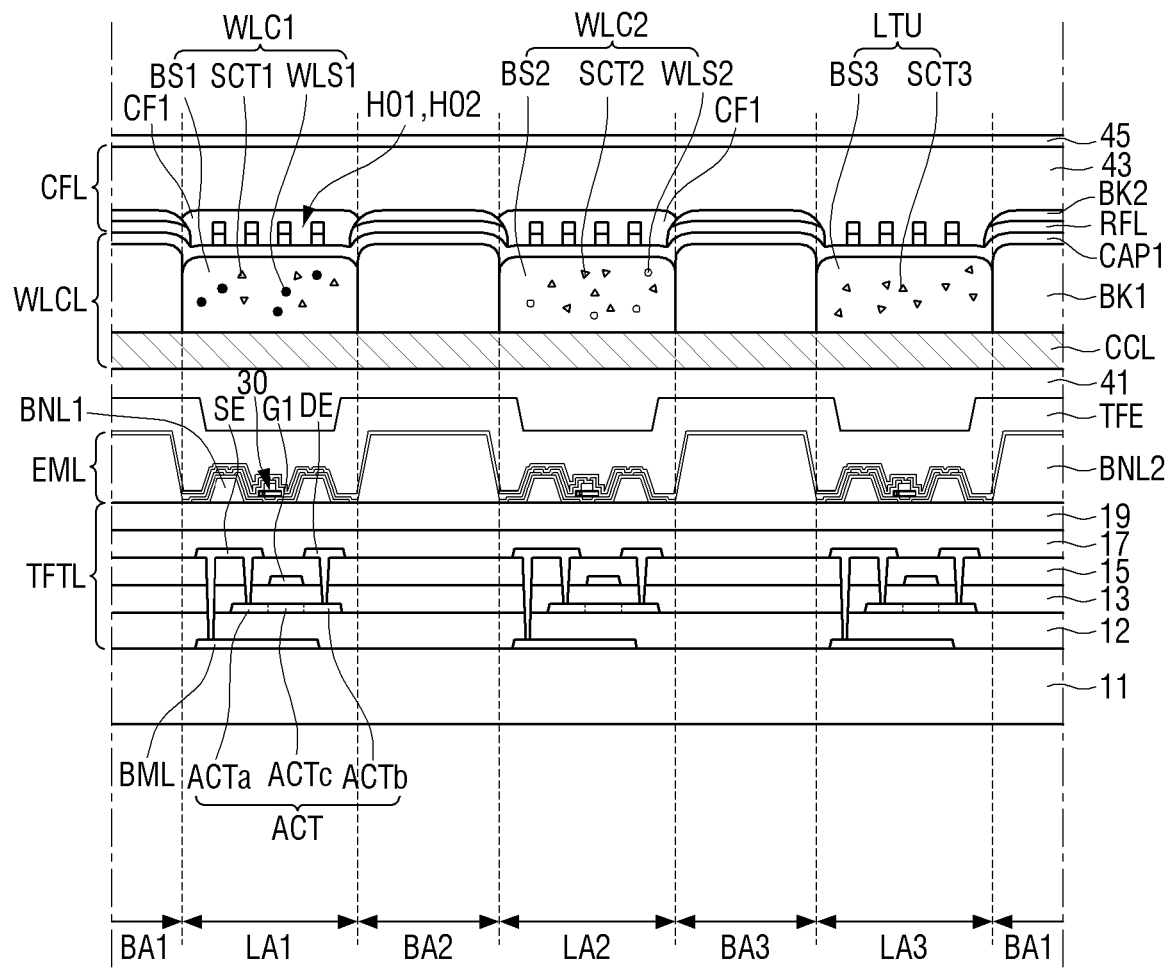
FIG. 11 is a cross-sectional view schematically illustrating some sub-pixels of a display device according to an embodiment.
Figure 12:
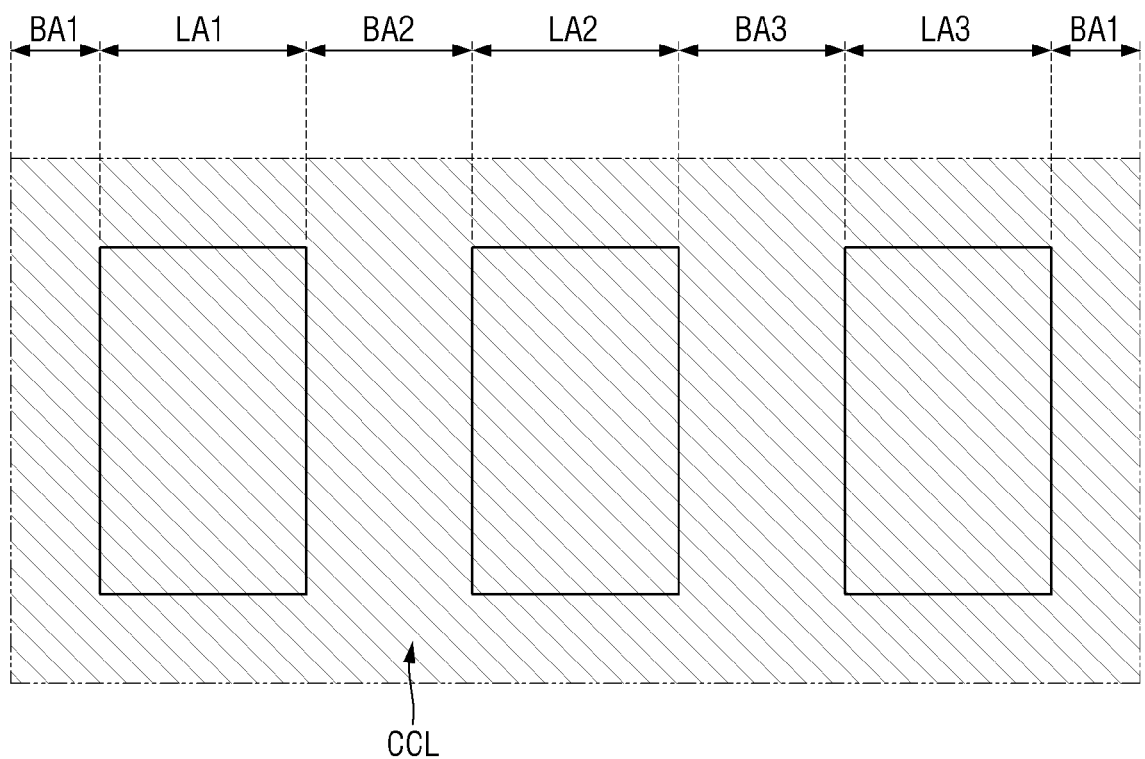
FIG. 12 is a plan view illustrating a color conversion member of a display device according to an embodiment.

FIG. 11 is a cross-sectional view schematically illustrating some sub-pixels of a display device according to an embodiment; and FIG. 12 is a plan view illustrating a color conversion member of the display device according to an embodiment.

Referring to FIGS. 11 and 12, a display device 10 according to an embodiment may include a color conversion member CCL. In the embodiment of FIGS. 11 and 12, there is a difference in that the arrangement of the color conversion member CCL is different from that of the embodiment of FIGS. 2 to 7. Herein, the description of the same configurations may be brief or omitted and the differences will be mainly described in further detail.

The display device 10 according to an embodiment may include a wavelength conversion layer WLCL including the color conversion member CCL. In an embodiment, the color conversion member CCL may be disposed on an entirety of a second planarization layer 41. For example, the color conversion member CCL may be disposed in first to third light emitting regions LA1, LA2, and LA3 and first to third light blocking regions BA1, BA2, and BA3 to overlap with the first to third light emitting regions LA1, LA2, and LA3 and the first to third light blocking regions BA1, BA2, and BA3. The color conversion member CCL may be disposed to overlap a first light blocking member BK1, a first wavelength conversion part WLC1, a second wavelength conversion part WLC2, and a light transmitting part LTU on the second planarization layer 41.

In an embodiment, since the color conversion member CCL is disposed on an entirety of the flat second planarization layer 41, a thickness of the color conversion member CCL may be uniformly or substantially uniformly formed. For example, the color conversion member CCL may have the same thickness in the first light emitting region LA1, the second light emitting region LA2, and the third light emitting region LA3.

In an embodiment, the color conversion member CCL may be disposed on the entirety of the second planarization layer 41 and may be formed by a solution process. For example, the color conversion member CCL may be formed by any of various solution processes, such as spin coating, slit coating, inkjet printing, and the like. Accordingly, since the color conversion member CCL may omit a mask process, manufacturing costs may be reduced.

Figure 13:
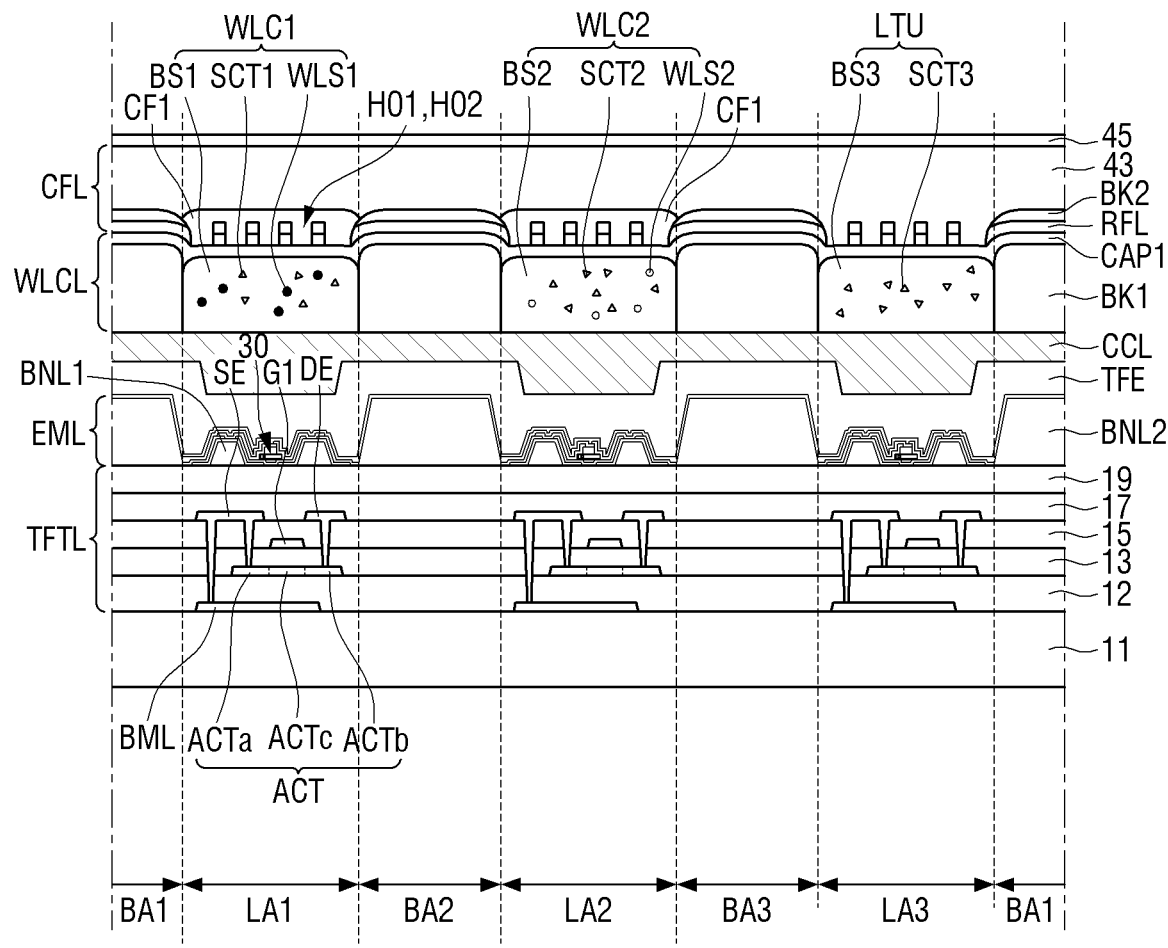
FIG. 13 is a cross-sectional view schematically illustrating some sub-pixels of a display device according to an embodiment.

FIG. 13 is a cross-sectional view schematically illustrating some sub-pixels of a display device according to an embodiment.

Referring to FIG. 13, a display device 10 according to an embodiment may include a wavelength conversion layer WLCL including a color conversion member CCL. In an embodiment, a second planarization layer 41 being omitted is different from the embodiment of FIGS. 2 to 7 and the embodiment of FIGS. 11 and 12. Herein, the description of the same configurations may be brief or omitted and the differences will be mainly described in further detail.

The display device 10 according to an embodiment may include the wavelength conversion layer WLCL including the color conversion member CCL. In an embodiment, the color conversion member CCL may be disposed on an entirety of an encapsulation layer TFE. In an embodiment, since the color conversion member CCL is formed by a solution process and is flat, the second planarization layer may be omitted and the color conversion member CCL may not only absorb external light but may also serve as a second planarization layer.

The color conversion member CCL may be disposed in first to third light emitting regions LA1, LA2, and LA3 and first to third light blocking regions BA1, BA2, and BA3 to overlap with the first to third light emitting regions LA1, LA2, and LA3 and the first to third light blocking regions BA1, BA2, and BA3. The color conversion member CCL may be disposed to overlap a first light blocking member BK1, a first wavelength conversion part WLC1, a second wavelength conversion part WLC2, and a light transmitting part LTU.

The color conversion member CCL may come into contact with an upper surface of the encapsulation layer TFE and may come into contact with lower surfaces of the first light blocking member BK1, the first wavelength conversion part WLC1, the second wavelength conversion part WLC2, and the light transmitting part LTU. In an embodiment, since the color conversion member CCL is disposed on the entirety of the encapsulation layer TFE and is formed by a solution process, a mask process may be omitted, and, thus, manufacturing costs may be reduced. Further, since the second planarization layer may be omitted, a process may be simplified.

In display devices according to various embodiments, since a color conversion member is included, reflection of external light can be reduced to improve display quality. Further, the display quality can be improved by improving light emitting efficiency of light provided from a light emitting element.

However, aspects and effects according to embodiments are not limited to the above, and other various aspects and effects are included in the specification.

Although some embodiments have been described herein, those skilled in the art will appreciate that many variations and modifications can be made to the embodiments without substantially departing from the principles of the present invention. Therefore, the disclosed embodiments of the invention are provided in a generic and descriptive sense and not for purposes of limitation.

What is claimed is:

1. A display device comprising:
    a substrate comprising a first light emitting region, a second light emitting region, a third light emitting region, and a light blocking region configured to partition the first to third light emitting regions;
    a plurality of light emitting elements on the substrate and respectively located in the first light emitting region, the second light emitting region, and the third light emitting region;
    a planarization layer on the plurality of light emitting elements;
    a wavelength conversion layer on the planarization layer and comprising wavelength conversion parts, a light transmitting part, and a color conversion member; and
    a color filter layer on the wavelength conversion layer and comprising a color filter,
    wherein the wavelength conversion parts are located in each of the first light emitting region and the second light emitting region,
    the light transmitting part is located in the third light emitting region, and
    the color conversion member does not overlap the light blocking region and is located between the planarization layer and the wavelength conversion part and between the planarization layer and the light transmitting part.

2. The display device of claim 1, wherein the color conversion member is located closer to the light emitting elements than the wavelength conversion parts and the light transmitting part.

3. The display device of claim 1, wherein the color conversion member transmits light having a color that is the same as a color of light emitted from the plurality of light emitting elements.

4. The display device of claim 3, wherein the color conversion member is a color filter configured to transmit blue light.

5. The display device of claim 1, wherein a refractive index of the color conversion member is greater than a refractive index of the planarization layer.

6. The display device of claim 1, wherein:
    the wavelength conversion layer comprises a first light blocking member on the planarization layer; and
    the first light blocking member overlaps the light blocking region and does not overlap the first light emitting region, the second light emitting region, and the third light emitting region.

7. The display device of claim 6, wherein the color conversion member, the wavelength conversion part, and the light transmitting part are located between the first light blocking member.

8. The display device of claim 1, wherein:
the color filter layer comprises a reflection layer and a second light blocking member on the wavelength conversion layer; and
the reflection layer and the second light blocking member overlap the first light emitting region, the second light emitting region, the third light emitting region, and the light blocking region.

9. The display device of claim 8, wherein:
the reflection layer comprises a plurality of first holes overlapping the first light emitting region, the second light emitting region, and the third light emitting region;
the second light blocking member comprises a plurality of second holes overlapping the first light emitting region, the second light emitting region, and the third light emitting region; and
the plurality of first holes and the plurality of second holes overlap each other.

10. The display device of claim 9, wherein planar shapes of the plurality of first holes and the plurality of second holes are stripe shapes or dot shapes.

11. The display device of claim 1, wherein the color filter is located in each of the first light emitting region and the second light emitting region and does not overlap the third light emitting region.

12. The display device of claim 11, wherein the color filter is a color filter configured to block blue light.

13. The display device of claim 1, further comprising:
a first electrode and a second electrode on the substrate and extending in a direction, a light emitting element of the plurality of light emitting elements being aligned on the first electrode and the second electrode; and
a first connection electrode connected to a first end portion of the light emitting element and a second connection electrode connected to a second end portion of the light emitting element.

14. The display device of claim 13, wherein the light emitting element comprises a first semiconductor layer, a second semiconductor layer on the first semiconductor layer, a light emitting layer between the first semiconductor layer and the second semiconductor layer, and an insulating film around the first semiconductor layer, the second semiconductor layer, and the light emitting layer.

15. A display device comprising:
a substrate comprising a first light emitting region, a second light emitting region, a third light emitting region, and a light blocking region configured to partition the first to third light emitting regions;
a plurality of light emitting elements on the substrate and located in each of the first light emitting region, the second light emitting region, and the third light emitting region;
an encapsulation layer on the plurality of light emitting elements;
a wavelength conversion layer on the encapsulation layer and comprising wavelength conversion parts, a light transmitting part, and a color conversion member; and
a color filter layer on the wavelength conversion layer and comprising a color filter,
wherein the color conversion member is located on the encapsulation layer,
the wavelength conversion parts are respectively located in each of the first light emitting region and the second light emitting region on the color conversion member,
the light transmitting part is located in the third light emitting region on the color conversion member, and
the color conversion member overlaps the first light emitting region, the second light emitting region, the third light emitting region, and the light blocking region.

16. The display device of claim 15, wherein:
the wavelength conversion layer comprises a first light blocking member overlapping the light blocking region; and
the color conversion member contacts an upper surface of the encapsulation layer and contacts lower surfaces of the first light blocking member, the wavelength conversion parts, and the light transmitting part.

17. The display device of claim 15, further comprising a planarization layer between the encapsulation layer and the color conversion member,
wherein a lower surface of the color conversion member contacts an upper surface of the planarization layer.

18. The display device of claim 17, wherein a thickness of the color conversion member is the same in the first light emitting region, the second light emitting region, and the third light emitting region.

19. The display device of claim 18, wherein a refractive index of the color conversion member is greater than a refractive index of the planarization layer.

20. The display device of claim 18, wherein the color conversion member transmits light having a color that is the same as a color of light emitted from the plurality of light emitting elements.

* * * * *